(12) United States Patent
Kubo

(10) Patent No.: US 11,996,499 B2
(45) Date of Patent: *May 28, 2024

(54) METHOD FOR MANUFACTURING LIGHT-EMITTING DEVICE

(71) Applicant: SHARP KABUSHIKI KAISHA, Sakai (JP)

(72) Inventor: Masumi Kubo, Sakai (JP)

(73) Assignee: SHARP KABUSHIKI KAISHA, Sakai (JP)

(*) Notice: Subject to any disclaimer, the term of this patent is extended or adjusted under 35 U.S.C. 154(b) by 393 days.

This patent is subject to a terminal disclaimer.

(21) Appl. No.: 17/430,593

(22) PCT Filed: Feb. 20, 2019

(86) PCT No.: PCT/JP2019/006368
§ 371 (c)(1),
(2) Date: Aug. 12, 2021

(87) PCT Pub. No.: WO2020/170368
PCT Pub. Date: Aug. 27, 2020

(65) Prior Publication Data
US 2022/0131049 A1    Apr. 28, 2022

(51) Int. Cl.
   *H01L 33/50*     (2010.01)
   *H01L 33/00*     (2010.01)
   *H01L 33/40*     (2010.01)

(52) U.S. Cl.
   CPC .......... *H01L 33/502* (2013.01); *H01L 33/005* (2013.01); *H01L 33/405* (2013.01);
   (Continued)

(58) Field of Classification Search
   CPC ... H01L 33/502; H01L 33/005; H01L 33/405; H01L 33/06; H01L 33/08; H01L 33/10; H01L 33/14; H01K 50/115; H01K 29/35
   See application file for complete search history.

(56) References Cited

U.S. PATENT DOCUMENTS

2022/0149338 A1* 5/2022 Kubo ..................... H05B 33/10

FOREIGN PATENT DOCUMENTS

JP          2017025220 A       2/2017

OTHER PUBLICATIONS

Masami Tanemura, "Random packing(Physics of Shape, Research Seminar Report)", Bussei Kenkyu (1984), 42 (1), 76-77, Apr. 20, 1984.

* cited by examiner

*Primary Examiner* — Marc Anthony Armand
(74) *Attorney, Agent, or Firm* — ScienBiziP, P.C.

(57) ABSTRACT

A method for manufacturing a light-emitting device includes forming the quantum dot layer. The forming the quantum dot layer includes: performing first application that involves applying a first solution on a position overlapping with the substrate; performing first light irradiation, that involves irradiating with light, from above the substrate, the position where the first solution is applied; performing second light irradiation, that involves irradiating the position with light to raise a temperature of the quantum dot; and performing third light irradiation, that involves irradiating the position with light to cause the first inorganic precursor to epitaxially grow around the first shell. In the performing third light irradiation, at least one set of the quantum dots adjacent to each other is connected to each other via the second shell.

34 Claims, 19 Drawing Sheets

(52) U.S. Cl.
 CPC .............. *H01L 2933/0016* (2013.01); *H01L 2933/0041* (2013.01)

METHOD FOR MANUFACTURING LIGHT-EMITTING DEVICE

TECHNICAL FIELD

The disclosure relates to a method for manufacturing a light-emitting device provided with a light-emitting element including quantum dots.

SUMMARY

Background Art

PTL 1 discloses a semiconductor nanoparticle (quantum dot) having a core/shell structure and a ligand that coordinates with the semiconductor nanoparticle.

CITATION LIST

Patent Literature

PTL 1: JP 2017-025220 A

Non Patent Literature

NPL 1: Tanemura Masami, "Random Packing (Physics on Form, Workshop Report)", Bussei Kenkyu (1984), 42 (1), 76-77

SUMMARY OF INVENTION

Technical Problem

The inventors have discovered an approach for further improving luminous efficiency of a light-emitting device in comparison with the light-emitting device provided with a quantum dot layer in which known quantum dots as disclosed in PTL 1 are simply layered.

Solution to Problem

In order to solve the above problem, a method for manufacturing a light-emitting device of the disclosure is a method for manufacturing a light-emitting device that is provided with, on a substrate, a light-emitting element including a first electrode, a second electrode, and a quantum dot layer interposed between the first electrode and the second electrode, the method including forming the quantum dot layer. The forming the quantum dot layer includes: performing first application that involves applying a first solution containing a plurality of quantum dots each including a core and a first shell with which the core is coated, a ligand to coordinate with each of the plurality of quantum dots, a first inorganic precursor, and a first solvent on a position overlapping with the substrate; performing first light irradiation, subsequent to the performing first application, that involves irradiating with light, from above the substrate, the position where the first solution is applied, to melt the ligand and vaporize the first solvent; performing second light irradiation, subsequent to the performing first light irradiation, that involves irradiating the position with light to raise a temperature of the quantum dot; and performing third light irradiation, subsequent to the performing second light irradiation, that involves irradiating the position with light to cause the first inorganic precursor to epitaxially grow around the first shell so as to form a second shell with which the first shell is coated. In the performing third light irradiation, at least one set of the quantum dots adjacent to each other is connected to each other via the second shell.

Advantageous Effects of Disclosure

According to the configurations described above, luminous efficiency may be further improved in a light-emitting device provided with quantum dots.

DESCRIPTION OF EMBODIMENTS

Figure 1:
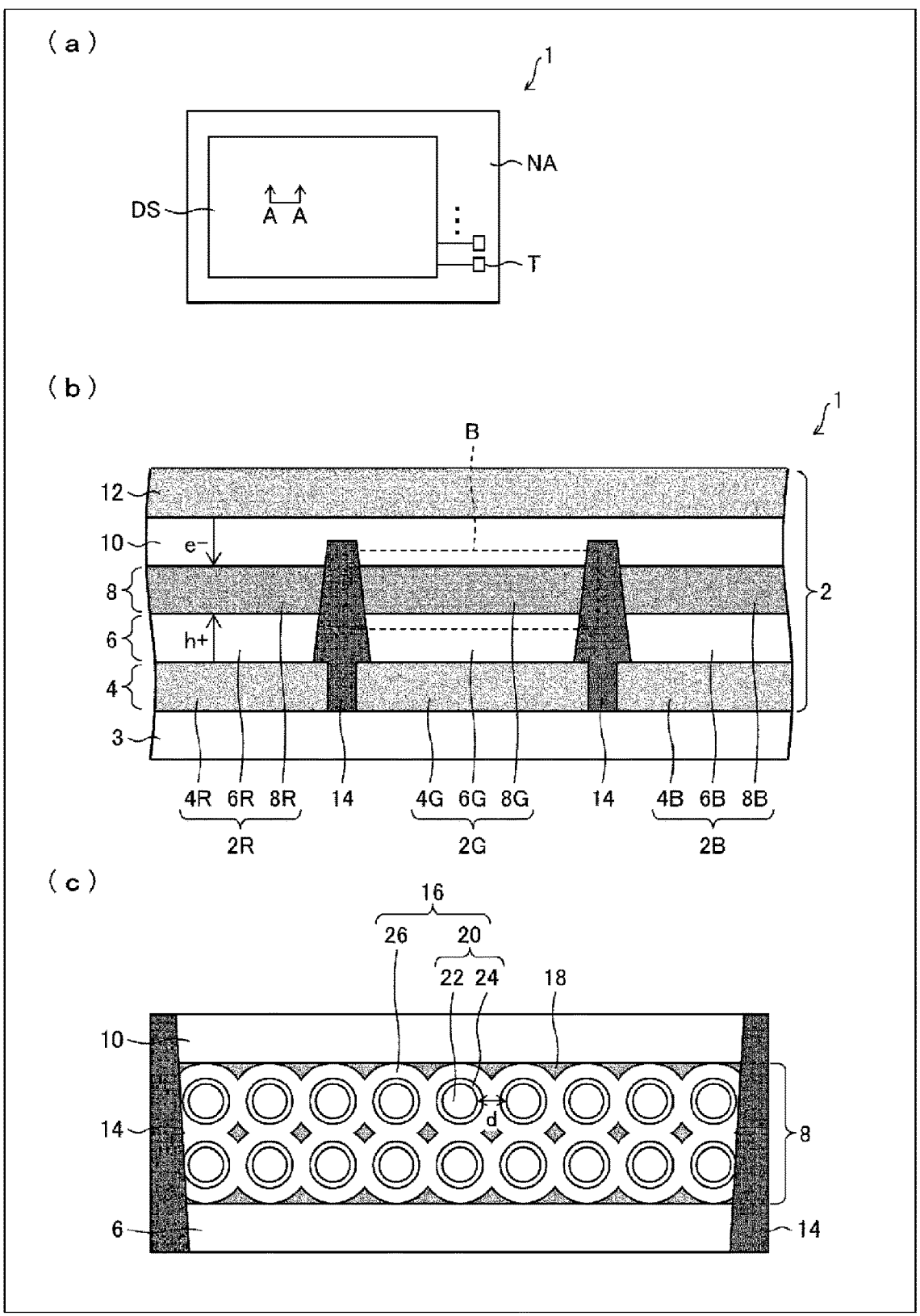
FIG. 1 includes a schematic top view and a schematic cross-sectional view of a light-emitting device according to a first embodiment of the disclosure, and a schematic enlarged view of a perimeter of a light-emitting layer of the light-emitting device.

First Embodiment (a) of FIG. 1 is a schematic top view of a light-emitting device 1 according to the present embodiment. (b) of FIG. 1 is a cross-sectional view taken along a line A-A in the direction of the arrows in (a) of FIG. 1. (c) of FIG. 1 is an enlarged cross-sectional view of a region B in (b) of FIG. 1, that is, an enlarged cross-sectional view of a perimeter of a second light-emitting layer 8G to be described later.

As illustrated in (a) of FIG. 1, the light-emitting device 1 according to the present embodiment includes a light-emitting face DS from which light emission is extracted and a frame region NA surrounding a periphery of the light-emitting face DS. In the frame region NA, a terminal T may be formed into which a signal for driving a light-emitting element of the light-emitting device 1 described in detail later is input.

At a position overlapping with the light-emitting face DS in plan view, as illustrated in (b) of FIG. 1, the light-emitting device 1 according to the present embodiment includes a light-emitting element layer 2 and an array substrate 3. The light-emitting device 1 has a structure in which respective layers of the light-emitting element layer 2 are layered on the array substrate 3, in which a thin film transistor (TFT; not illustrated) is formed. In the present specification, a direction from the light-emitting element layer 2 to the array substrate 3 of the light-emitting device 1 is referred to as "downward direction", and a direction from the light-emitting element layer 2 to the light-emitting face DS of the light-emitting device 1 is referred to as "upward direction".

The light-emitting element layer 2 includes, on a first electrode 4, a first charge transport layer 6, a light-emitting layer 8 as a quantum dot layer, a second charge transport layer 10, and a second electrode 12, which are sequentially layered from the lower layer. The first electrode 4 of the light-emitting element layer 2 formed in the upper layer of the array substrate 3 is electrically connected to the TFT of the array substrate 3. In the present embodiment, the first electrode 4 is an anode electrode and the second electrode 12 is a cathode electrode, for example.

In the present embodiment, the light-emitting element layer 2 includes a first light-emitting element 2R, a second light-emitting element 2G, and a third light-emitting element 2B. The first light-emitting element 2R, the second light-emitting element 2G, and the third light-emitting element 2B are QLED elements in which the light-emitting layer 8 includes a semiconductor nanoparticle material, that is, a quantum dot material.

Each of the first electrode 4, the first charge transport layer 6, and the light-emitting layer 8 is separated by edge covers 14. In particular, in the present embodiment, the first electrode 4 is, by the edge covers 14, separated into a first electrode 4R for the first light-emitting element 2R, a first electrode 4G for the second light-emitting element 2G, and a first electrode 4B for the third light-emitting element 2B. The first charge transport layer 6 is, by the edge covers 14, separated into a first charge transport layer 6R for the first light-emitting element 2R, a first charge transport layer 6G for the second light-emitting element 2G, and a first charge transport layer 6B for the third light-emitting element 2B. Further, the light-emitting layer 8 is, by the edge covers 14, separated into a first light-emitting layer 8R, the second light-emitting layer 8G, and a third light-emitting layer 8B.

The second charge transport layer 10 and the second electrode 12 are not separated by the edge covers 14, and are each formed in a shared manner. As illustrated in (b) of FIG. 1, the edge covers 14 may be formed at the positions to cover side surfaces of the first electrode 4 and the vicinity of peripheral end portions of an upper face thereof.

In the present embodiment, the first light-emitting element 2R includes the first electrode 4R, the first charge transport layer 6R, the first light-emitting layer 8R, the second charge transport layer 10, and the second electrode 12. The second light-emitting element 2G includes the first electrode 4G, the first charge transport layer 6G, the second light-emitting layer 8G, the second charge transport layer 10, and the second electrode 12. Furthermore, the third light-emitting element 2B includes the first electrode 4B, the first charge transport layer 6B, the third light-emitting layer 8B, the second charge transport layer 10, and the second electrode 12.

In the present embodiment, the first light-emitting layer 8R, the second light-emitting layer 8G, and the third light-emitting layer 8B emit red light that is light of a first color, green light that is light of a second color, and blue light that is light of a third color, respectively. In other words, the first light-emitting element 2R, the second light-emitting element 2G, and the third light-emitting element 2B are light-emitting elements that emit the red light, the green light, and the blue light, respectively, which are different colors from each other.

Here, the blue light is, for example, light having a light emission center wavelength in a wavelength band of 400 nm or more and 500 nm or less. Further, the green light is, for example, light having a light emission center wavelength in a wavelength band of greater than 500 nm and 600 nm or less. Further, the red light is, for example, light having a light emission center wavelength in a wavelength band of greater than 600 nm and 780 nm or less.

The first electrode 4 and the second electrode 12 include conductive materials and are electrically connected to the first charge transport layer 6 and the second charge transport layer 10, respectively. Of the first electrode 4 and the second electrode 12, the electrode closer to the light-emitting face DS is a transparent electrode.

In particular, in the present embodiment, the array substrate 3 is a transparent substrate, and the first electrode 4 is a transparent electrode. The second electrode 12 may be a reflective electrode. Therefore, light from the light-emitting layer 8 passes through the first charge transport layer 6, the first electrode 4, and the array substrate 3, and is emitted from the light-emitting face DS to the outside of the light-emitting device 1. Due to this, the light-emitting device 1 is configured as a bottom-emitting type light-emitting device. Since both the light emitted in the upward direction from the light-emitting layer 8 and the light emitted in the downward direction from the light-emitting layer 8 are available as light emission from the light-emitting device 1, the light-emitting device 1 can improve the usage efficiency of the light emitted from the light-emitting layer 8.

Note that the configuration of the first electrode 4 and the second electrode 12 described above is an example, and may be configured with other materials.

The first charge transport layer 6 is a layer that transports charges from the first electrode 4 to the light-emitting layer 8. The first charge transport layer 6 may have a function of inhibiting the transport of charges from the second electrode 12. In the present embodiment, the first charge transport layer 6 may be a hole transport layer that transports positive holes from the first electrode 4, which is an anode electrode, to the light-emitting layer 8.

The second charge transport layer 10 is a layer that transports the charge from the second electrode 12 to the light-emitting layer 8. The second charge transport layer 10 may have a function of inhibiting the transport of the charges from the first electrode 4. In the present embodiment, the second charge transport layer 10 may be an electron transport layer that transports electrons from the second electrode 12, which is a cathode electrode, to the light-emitting layer 8.

Next, the configuration of the light-emitting layer 8 will be described in detail with reference to (c) of FIG. 1. Note that, (c) of FIG. 1 is a schematic cross-sectional view of the region B in (b) of FIG. 1, that is, a schematic cross-sectional view of the periphery of the second light-emitting layer 8G of the second light-emitting element 2G. However, in the present embodiment, unless otherwise indicated, members illustrated in (c) of FIG. 1 are considered to have configurations common to each of the light-emitting elements. Accordingly, in the present embodiment, unless otherwise indicated, the members illustrated in (c) of FIG. 1 may have the same configurations as those in each of the light-emitting elements.

In the present embodiment, the light-emitting layer 8 includes a quantum dot structure 16 and a ligand 18. The quantum dot structure 16 includes a plurality of quantum dots 20. The quantum dot 20 has a core/shell structure including a core 22 and a first shell 24, with which the periphery of the core 22 is coated. The quantum dot structure 16 also includes a second shell 26. The periphery of the first shell 24, which is an outer shell of each quantum dot 20, is coated with the second shell 26.

The quantum dot 20 may have a multi-shell structure in which a plurality of shells are provided around the core 22. In this case, the first shell 24 refers to a shell corresponding to the outermost layer among the plurality of shells.

The ligand 18 may coordinate with the quantum dot structure 16 on an outer surface of the second shell 26 to fill a void in the quantum dot structure 16. The ligand 18 may be, for example, trioctylphosphine oxide (TOPO).

Among the quantum dots 20, at least one set of quantum dots 20 adjacent to each other is connected to each other via the second shell 26. The first shell 24 and the second shell 26 have a crystal structure, and in particular, in the present embodiment, the second shell 26 has a crystal structure formed by epitaxial growth on the first shell 24. Thus, the adjacent quantum dots 20 described above are connected to each other by the crystal structure of the second shell 26. In the present embodiment, all the quantum dots 20 within an identical light-emitting element may be connected to each other by the crystal structure of the second shell 26 to form the integral quantum dot structure 16. The first shell 24 and the second shell 26 may be polycrystalline.

The core 22 and first shell 24 of the quantum dot 20 may include an inorganic material used for the quantum dots of a known core/shell structure. In other words, the first light-emitting layer 8R, the second light-emitting layer 8G, and the third light-emitting layer 8B may include known quantum dot materials used for light-emitting layers of red, green, and blue QLED elements, respectively.

In addition, similar to the first shell 24, the second shell 26 may include an inorganic shell material used for the quantum dots of a known core/shell structure. The first shell 24 and the second shell 26 may be made of the same material. The specific resistance of the second shell 26 is preferably greater than or equal to the specific resistance of the first shell 24. The magnitude of the band gap of the second shell 26 is preferably greater than or equal to the magnitude of the band gap of the first shell 24. With this configuration, the efficiency of charge injection from the second shell 26 to the first shell 24 is improved.

Examples of specific materials for the core 22 include group II-VI semiconductors such as CdSe (band gap 1.73 eV), CdTe (band gap 1.44 eV), ZnTe (band gap 2.25 eV), and CdS (band gap 2.42 eV). Examples of other specific materials for the core 22 include the group III-V such as InP (band gap 1.35 eV) and InGaP (band gap 1.88 eV).

In general, the wavelength emitted by the quantum dot is determined by the particle diameter of the core. Therefore, it is preferable to employ a semiconductor material having an appropriate band gap as a material of the core 22 in order to control the light emitted from the core 22 to be any of red, green, and blue colors, by controlling the particle diameter of the core 22.

The band gap of the material of the core 22 included in the first light-emitting layer 8R is preferably equal to or lower than 1.97 eV in order for the first light-emitting layer 8R serving as a red light-emitting layer to emit red light having a wavelength of 630 nm. In order for the second light-emitting layer 8G serving as a green light-emitting layer to emit green light having a wavelength of 532 nm, the band gap of the material of the core 22 included in the second light-emitting layer 8G is preferably equal to or lower than 2.33 eV. Furthermore, in order for the third light-emitting layer 8B serving as a blue light-emitting layer to emit blue light having a wavelength of 450 nm, the band gap of the material of the core 22 included in the third light-emitting layer 8B is preferably equal to or lower than 2.66 eV. The light-emitting device 1 provided with the first light-emitting layer 8R, the second light-emitting layer 8G, and the third light-emitting layer 8B is preferable from the perspective of satisfying the color space criteria in the International Standard BT 2020 of UHDTV.

Examples of specific materials for the first shell 24 and the second shell 26 include the group II-VI such as ZnSe (band gap 2.7 eV) and ZnS (band gap 3.6 eV), and the group III-V such as GaP (band gap 2.26 eV).

The material of the core 22 preferably has low specific resistance and a small band gap compared to the material of the first shell 24 and the second shell 26. With this configuration, the efficiency of charge injection from the first shell 24 and second shell 26 to the core 22 is improved.

In the present embodiment, the average film thickness of the first shell 24 from the outer surface of the core 22 is less than a minimum film thickness of the second shell 26. The minimum film thickness of the second shell 26 refers to the smallest film thickness of the film thickness of the second shell 26 between two quantum dots 20 connected to each other via the second shell 26 and the film thickness from the first shell 24 to the outer surface of the second shell 26.

As illustrated in (c) of FIG. 1, the shortest distance from the core 22 of one quantum dot 20 to the core 22 of another quantum dot 20 adjacent thereto is defined as d. For example, when the core 22 is made of InP, and the first shell 24 and second shell 26 are made of ZnS, an average value of the distance d is preferably equal to or greater than 3 nm. For example, when the core 22 is made of CdSe, and the first shell 24 and second shell 26 are made of ZnS, an average value of the distance d is preferably equal to or greater than 1 nm. With this configuration, the electron exudation from the core 22, derived from the electron wave function, may be efficiently reduced by the first shell 24 and the second shell 26.

In the present embodiment, a quantum dot 20 absorbs light having a wavelength shorter than the wavelength of light emitted by the quantum dot 20 itself. In particular, the quantum dot 20 absorbs ultraviolet light. Further, the quantum dot 20 generates heat when absorbing light.

Figure 2:
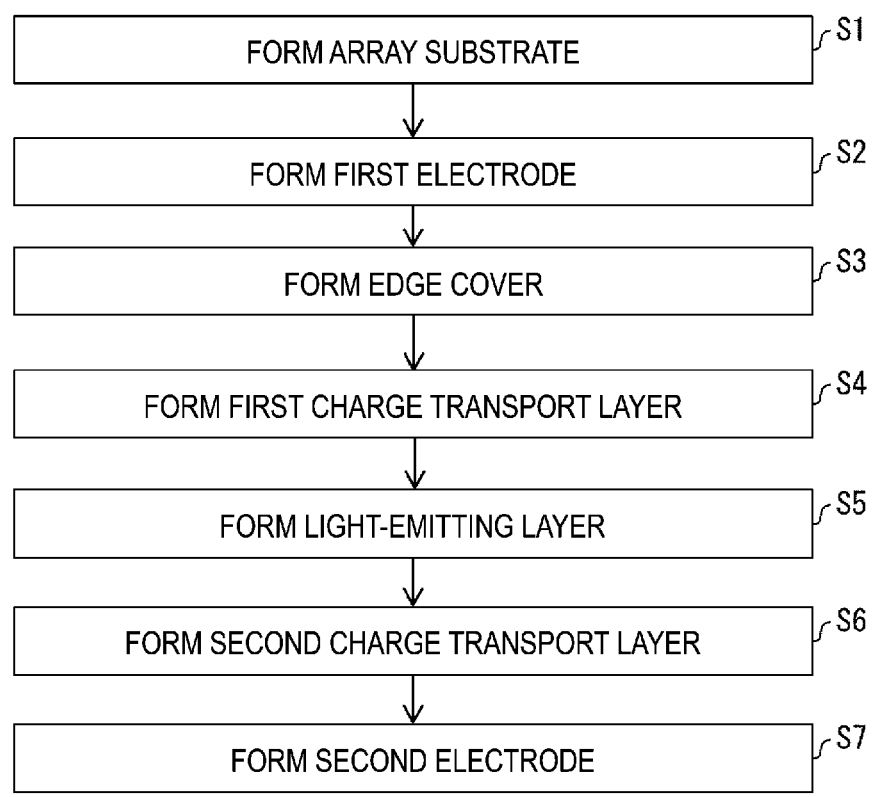
FIG. 2 is a flowchart for describing a method for manufacturing a light-emitting device according to the first embodiment of the disclosure.

Next, a method for manufacturing the light-emitting device 1 according to the present embodiment will be described with reference to FIG. 2. FIG. 2 is a flowchart for describing the method for manufacturing the light-emitting device 1 according to the present embodiment.

First, an array substrate is formed (step S1). Formation of the array substrate may be performed by forming a plurality of TFTs on the substrate to match positions of the subpixels.

Next, the first electrode 4 is formed (step S2). In step S2, for example, after a transparent electrode material having electrical conductivity, such as ITO, is film-formed by sputtering, the first electrode 4 may be formed for each subpixel by patterning while matching a shape of the subpixel. Alternatively, the first electrode may be formed for each subpixel by vapor-depositing a transparent electrode material by using a vapor deposition mask.

Next, the edge covers 14 are formed (step S3). The edge covers 14, after being applied on the array substrate 3 and the first electrode 4, may be obtained by patterning while leaving the positions covering the side surfaces and peripheral end portions of the first electrodes 4 between the adjacent first electrodes 4. The patterning of the edge covers 14 may be performed by photolithography.

Next, the first charge transport layer 6 is formed (step S4). The first charge transport layer 6 may be formed for each subpixel by separately patterning with an ink-jet method, vapor deposition using a mask, or patterning using photolithography.

Next, the light-emitting layer 8 is formed (step S5). The step of forming the light-emitting layer 8 will be described in more detail with reference to FIGS. 3 to 6.

Figure 3:
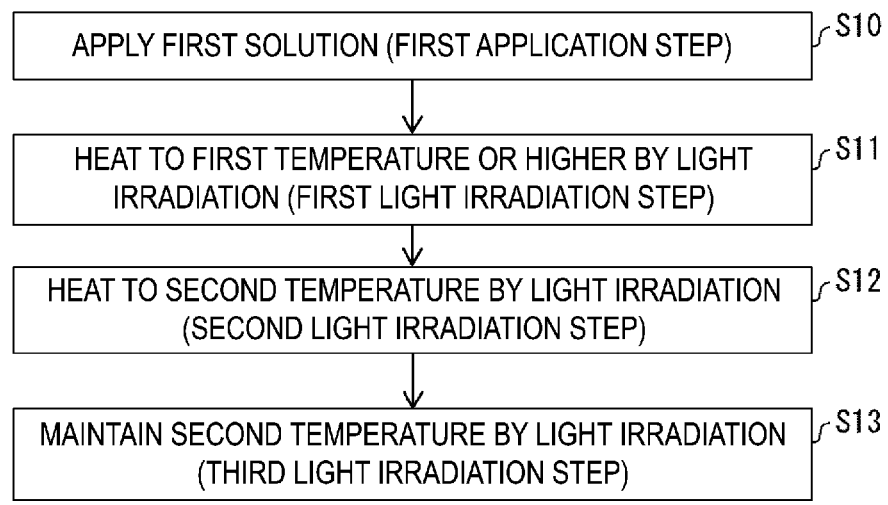
FIG. 3 is a flowchart for describing a method for forming a light-emitting layer according to the first embodiment of the disclosure.

FIG. 3 is a flowchart for describing the step of forming the light-emitting layer corresponding to a step of forming a quantum dot layer in the present embodiment.

Figure 4:
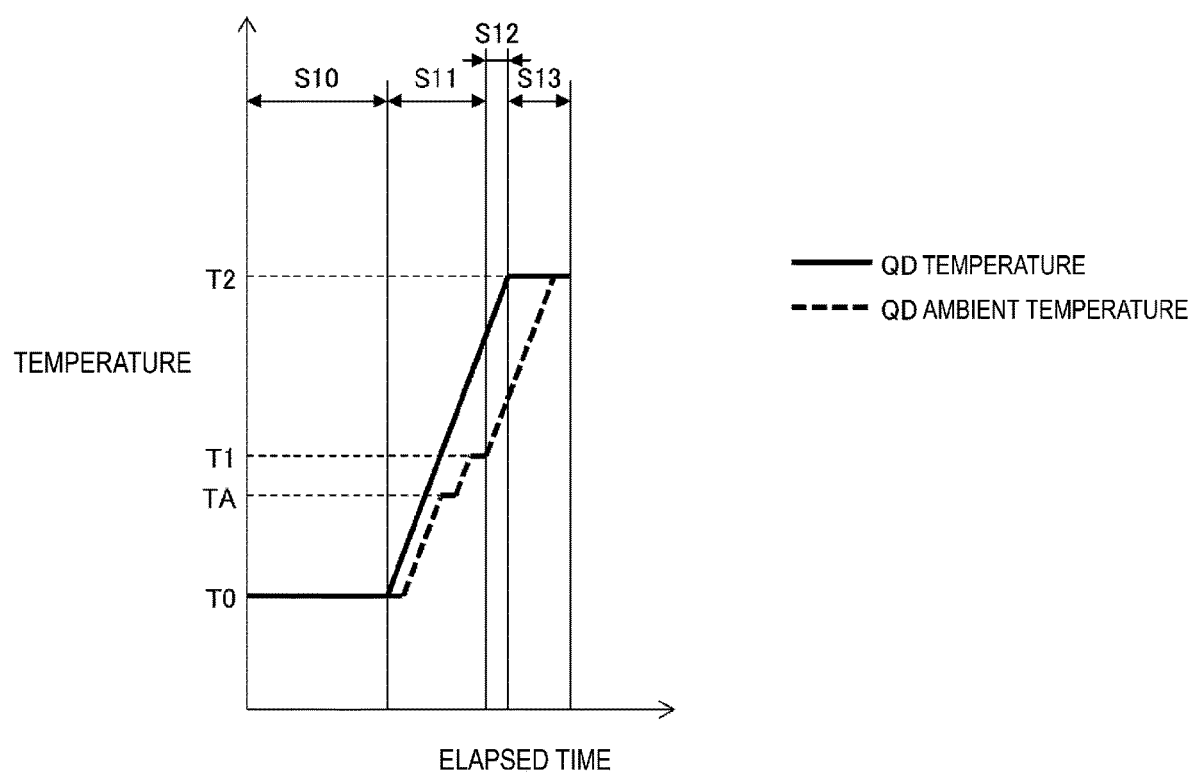
FIG. 4 is a graph for describing a relationship between an elapsed time and a temperature in a step of forming a light-emitting layer according to the first embodiment of the disclosure.

FIG. 4 is a graph for describing a relationship between an elapsed time and a temperature in the step of forming the light-emitting layer. In FIG. 4, the horizontal axis represents the elapsed time of the step of forming the light-emitting layer, and the vertical axis represents the temperature. A solid line in FIG. 4 depicts a temperature of the quantum dot 20 on the array substrate 3, and a broken line depicts a temperature around the quantum dot 20.

Figure 5:
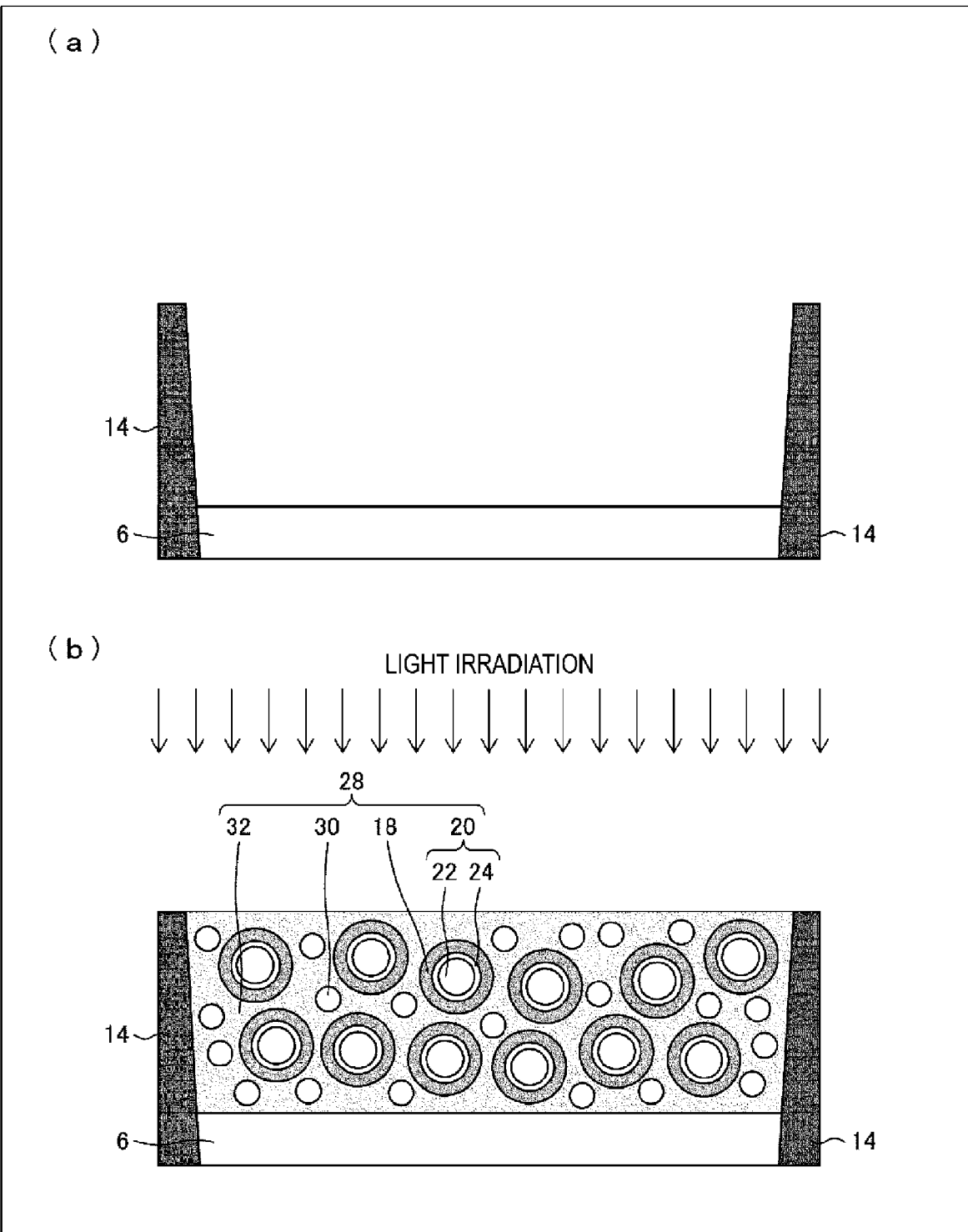
FIG. 5 is a forming-step cross-sectional view for describing a step of forming a light-emitting layer according to the first embodiment of the disclosure.
Figure 6:
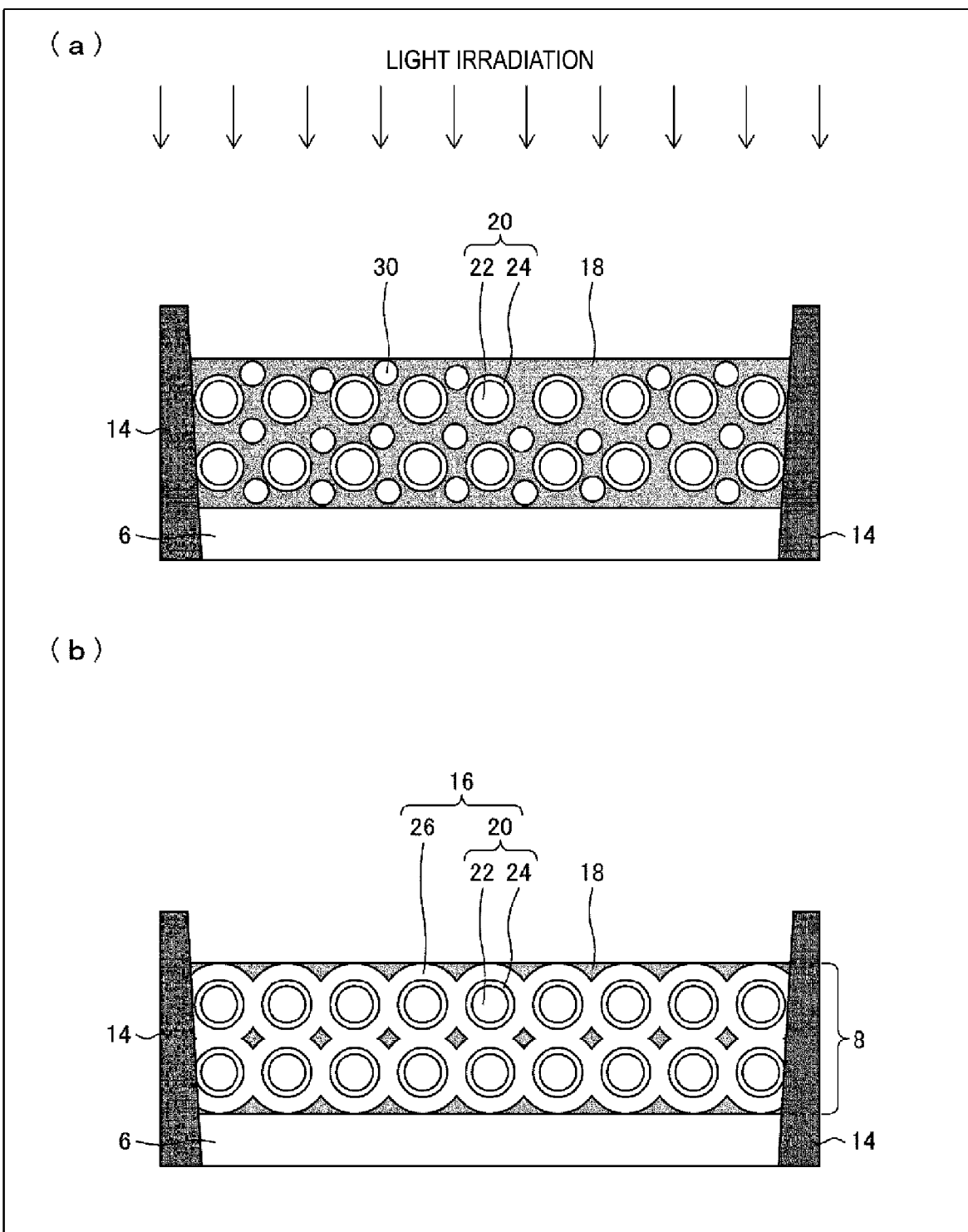
FIG. 6 is another forming-step cross-sectional view for describing a step of forming a light-emitting layer according to the first embodiment of the disclosure.

FIGS. 5 and 6 are forming-step cross-sectional views for describing the step of forming the light-emitting layer. Hereinafter, each of the forming-step cross-sectional views including FIGS. 5 and 6 of the present specification illustrates the forming-step cross-sectional view of the region B in (b) of FIG. 1, that is, the forming-step cross-sectional view at the position corresponding to the periphery of the second light-emitting layer 8G of the second light-emitting element 2G, unless otherwise specified. However, the techniques described with reference to the forming-step cross-sectional views in the present specification may be applied to the method for forming the light-emitting layer 8 of the other light-emitting elements, unless otherwise specified.

As illustrated in (a) of FIG. 5, the formation up to the first charge transport layer 6 has been performed on the array substrate 3 until the step of forming the light-emitting layer. In the step of forming the light-emitting layer, first, a step of first application is performed in which a first solution 28 illustrated in (b) of FIG. 5 is applied on a position overlapping with the array substrate 3 (step S10).

The first solution 28 is a solution in which the plurality of quantum dots 20 with the ligand 18 being coordinated and a first inorganic precursor 30 are dispersed in a first solvent 32, as illustrated in (b) of FIG. 5. The first solvent 32 may be, for example, hexane. The first inorganic precursor 30 contains the same material as the second shell 26 described above. The first inorganic precursor 30 may contain, for example, zinc chloride and 1-Dodecanethiol.

The step of the first application is performed at an atmospheric temperature of a temperature T0, as illustrated in FIG. 4. Since the application of the first solution 28 is performed at the atmospheric temperature of the temperature T0, the temperature of the quantum dots 20 in the first solution 28 to be applied and an ambient temperature of the quantum dots 20 also take the temperature T0, as illustrated in FIG. 4. The temperature T0 may be, for example, an ordinary temperature.

Subsequently, a step of first light irradiation is performed in which the first solution 28 on the array substrate 3 is irradiated with light such as ultraviolet light so as to heat the quantum dots 20 (step S11). In the step of the first light irradiation, the quantum dots 20 are heated until the quantum dots 20 have a first temperature T1 or higher as indicated in FIG. 4.

The first temperature T1 is the higher temperature of the melting point of the ligand 18 and the boiling point of the first solvent 32. A temperature TA indicated in FIG. 4 is the lower temperature of the melting point of the ligand 18 and the boiling point of the first solvent 32. The first temperature T1 and the temperature TA are higher than the temperature T0.

The melting point of TOPO is in a range from 50 degrees Celsius to 54 degrees Celsius, and the boiling point of hexane is in a range from 68.5 degrees Celsius to 69.1 degrees Celsius. Accordingly, in a case where the ligand 18 is TOPO and the first solvent is hexane, the temperature TA is the melting point of the TOPO, and the first temperature T1 is the boiling point of the hexane.

The ambient temperature of the quantum dots 20 follows a rise of the temperature of the quantum dots 20 with a slight delay, as depicted in FIG. 4, until the temperature of the quantum dots 20 rises from the temperature T0 to the temperature TA. However, when the ambient temperature of the quantum dots 20 rises up to the temperature TA and one of the melting of the ligand 18 and the evaporation of the first solvent 32 begins, the ambient temperature of the quantum dots 20 maintains the temperature TA for a while.

By further carrying on the first light irradiation, one of the melting of the ligand 18 and the evaporation of the first solvent 32 ends, and the ambient temperature of the quantum dots 20 begins to rise again. Then, when the ambient temperature of the quantum dots 20 rises up to the first temperature T1 and the other one of the melting of the ligand 18 and the evaporation of the first solvent 32 begins, the ambient temperature of the quantum dots 20 maintains the first temperature T1 for a while.

Thus, the melting of the ligand 18 and the evaporation of the first solvent 32 are completed by the step of the first light irradiation. When the first temperature T1 is the boiling point of the first solvent 32, in the step of the first light irradiation, the first solvent 32 vaporizes after the ligand 18 has melted. On the other hand, when the first temperature T1 is the melting point of the ligand 18, in the step of the first light irradiation, the ligand 18 melts after the first solvent 32 has vaporized.

In a case where the melting of the ligand 18 is earlier than the vaporization of the first solvent 32, immediately after the vaporization of the first solvent 32, aggregate of the quantum dots 20, around which the solid ligand 18 is attached, is formed in an upper layer relative to the first charge transport layer 6. Since the aggregate is unstable as a film, it is difficult for the first inorganic precursor 30 to be present in some case. Accordingly, in the step of the first light irradiation, from the perspective of forming a stable film including the quantum dots 20 and the first inorganic precursor 30, it is preferable that the first solvent 32 vaporize after the melting of the ligand 18.

After the completion of the step of the first light irradiation, as illustrated in (a) of FIG. 6, the first solvent 32 has vaporized from above the array substrate 3, and the quantum dots 20 and the first inorganic precursor 30 are dispersed in the melted ligand 18.

Subsequently, a step of second light irradiation is performed in which the second light irradiation is performed on the position where the first solution 28 has been applied on the array substrate 3 so as to heat the quantum dots 20 (step S12). In the step of the second light irradiation, the second light irradiation is continued until the temperature of the quantum dots 20 reaches a second temperature T2 indicated in FIG. 4. In the second light irradiation, ultraviolet light may be emitted as in the first light irradiation, or light having a larger amount of energy per unit time than the light emitted in the first light irradiation may be emitted. The first light irradiation and the second light irradiation may be performed continuously.

Subsequently, from the point in time when the temperature of the quantum dots 20 reaches the second temperature T2, a step of third light irradiation is performed in which the third light irradiation is performed to maintain the temperature of the quantum dots 20 at approximately the second temperature T2 (step S13). In the third light irradiation, ultraviolet light may be emitted as in the first light irradiation and second light irradiation, or light having a smaller amount of energy per unit time than the light emitted in the second light irradiation may be emitted. Since the temperature of the quantum dots 20 is maintained at the second temperature T2 in the step of the third light irradiation, the ambient temperature of the quantum dots 20 after having reached the second temperature T2 is also maintained at the second temperature T2.

In each of the steps of light irradiation in the present embodiment, when an amount of heat generated in the quantum dots 20 and an amount of heat dissipated toward the peripheral environment of the array substrate 3 are balanced, the temperature around the quantum dots 20 is substantially constant at a certain temperature. The irradiation energy of each light irradiation may be adjusted so that the temperature at which the amount of heat generated in the quantum dots 20 and the amount of heat dissipated toward the peripheral environment of the array substrate 3 are balanced is the second temperature T2. With this, a condition of intensity of light emitted in each of the first light irradiation, the second light irradiation, and the third light irradiation may be the same.

The second temperature T2 is higher than the first temperature T1, and is a temperature at which the first inorganic precursor 30 epitaxially grows around the first shell 24 by thermochemical reaction. Thus, while the ambient temperature of the quantum dots 20 is maintained at the second temperature T2, the first inorganic precursor 30 gradually grows epitaxially around the first shell 24. With this, the second shell 26 is formed around the first shell 24 of each quantum dot 20, as illustrated in (b) of FIG. 6. When the first inorganic precursor 30 contains zinc chloride and 1-Dodecanethiol as discussed above, the second temperature T2 is approximately 200 degrees Celsius.

The second shell 26 is formed in such a manner that the film thickness gradually increases from the outer surface of the first shell 24 around each quantum dot 20. At a position where the sum of the film thicknesses of the second shells 26 formed around two quantum dots 20 adjacent to each other is greater than a distance between the first shells 24 of the quantum dots 20 adjacent to each other, the two quantum dots 20 are connected via the second shells 26. In the present embodiment, the step of the third light irradiation is performed until at least one set of adjacent quantum dots 20 is connected to each other via the second shells 26.

As described above, as illustrated in (b) of FIG. 6, the quantum dot structure 16 including the quantum dot 20 and the second shell 26 is formed. After this, the light irradiation with respect to the array substrate 3 is stopped and cooling is carried out, whereby the melted ligand 18 is solidified again. As a result, the light-emitting layer 8 including the quantum dot structure 16 and the ligand 18 illustrated in (b) of FIG. 6 is obtained.

Note that in the present embodiment, the step of forming the light-emitting layer 8 is described with reference to the enlarged cross-sectional view of the periphery of the second light-emitting layer 8G. However, a difference in the forming method of each of the first light-emitting layer 8R, second light-emitting layer 8G, and third light-emitting layer 8B is only a difference in the materials contained in the first solution 28. That is, regardless of luminescent colors of the light-emitting layer 8 to be formed, the steps of the first application, first light irradiation, second light irradiation, and third light irradiation may be implemented by the same method.

In the step of the first application, the material contained in the first solution 28 may be changed for each luminescent color of the corresponding light-emitting element, and the first solution 28 may be subjected to separately patterning by an ink-jet method. Specifically, the first solution 28 may be individually applied, by an ink-jet method, on a position overlapping with each of the first electrodes 4 formed for each light emitting element. Then, the steps of the first light irradiation, second light irradiation, and third light irradiation described above may be performed. As a result, the light-emitting elements having different luminescent colors can be formed by continuous single light irradiation.

The concentration of the first inorganic precursor 30 in the first solution 28 applied in the step of the first application may differ depending on the luminescent color of the corresponding light-emitting element. In particular, the concentration of the first inorganic precursor 30 in the first solution 28 applied at a position corresponding to the second light-emitting element 2G is preferably lower than the concentration of the first inorganic precursor 30 in the first solution 28 applied at a position corresponding to the first light-emitting element 2R. The concentration of the first inorganic precursor 30 in the first solution 28 applied at the position corresponding to the second light-emitting element 2G is preferably higher than the concentration of the first inorganic precursor 30 in the first solution 28 applied at a position corresponding to the third light-emitting element 2B.

In the step of epitaxially growing the second shell 26 around the quantum dot 20, the longer the particle diameter of the quantum dot 20, the larger the amount of the first inorganic precursor 30 needed to form the second shell 26 of the same film thickness is in the case where the amount of light irradiation is the same. In general, the longer the wavelength of light emitted from the quantum dot 20, the longer the particle diameter of the core 22 is, which makes the particle diameter of the quantum dot 20 longer.

Accordingly, as in the configuration described above, by increasing the concentration of the first inorganic precursor 30 in the first solution 28 as the wavelength of the light emitted from the corresponding light-emitting element is longer, forming conditions of the light-emitting layers may be brought to be closer to each other. As a result, a variation in film thickness of the second shells 26 may be suppressed among the quantum dots 20 having mutually different particle diameters.

In the step of forming the light-emitting layer, after the first solution 28 is applied at a position overlapping with the first electrode 4 in the step of the first application, partial exposure by laser irradiation may be performed in each of the first light irradiation, second light irradiation, and third light irradiation. Thereafter, a step of removal may be performed in which the first solution 28 is removed from a position overlapping with a position different from the position where the partial exposure was performed. As a result, the light-emitting layer 8 may be formed only at the position partially exposed by the laser irradiation.

In the step of forming the light-emitting layer, after the first solution 28 is applied at a position overlapping with the first electrode 4 in the step of the first application, partial exposure using a photomask may be performed in each of the first light irradiation, second light irradiation, and third light irradiation. The method for forming the light-emitting layer 8 by partial exposure using a photomask will be described in more detail with reference to FIGS. 7 and 8.

Figure 7:
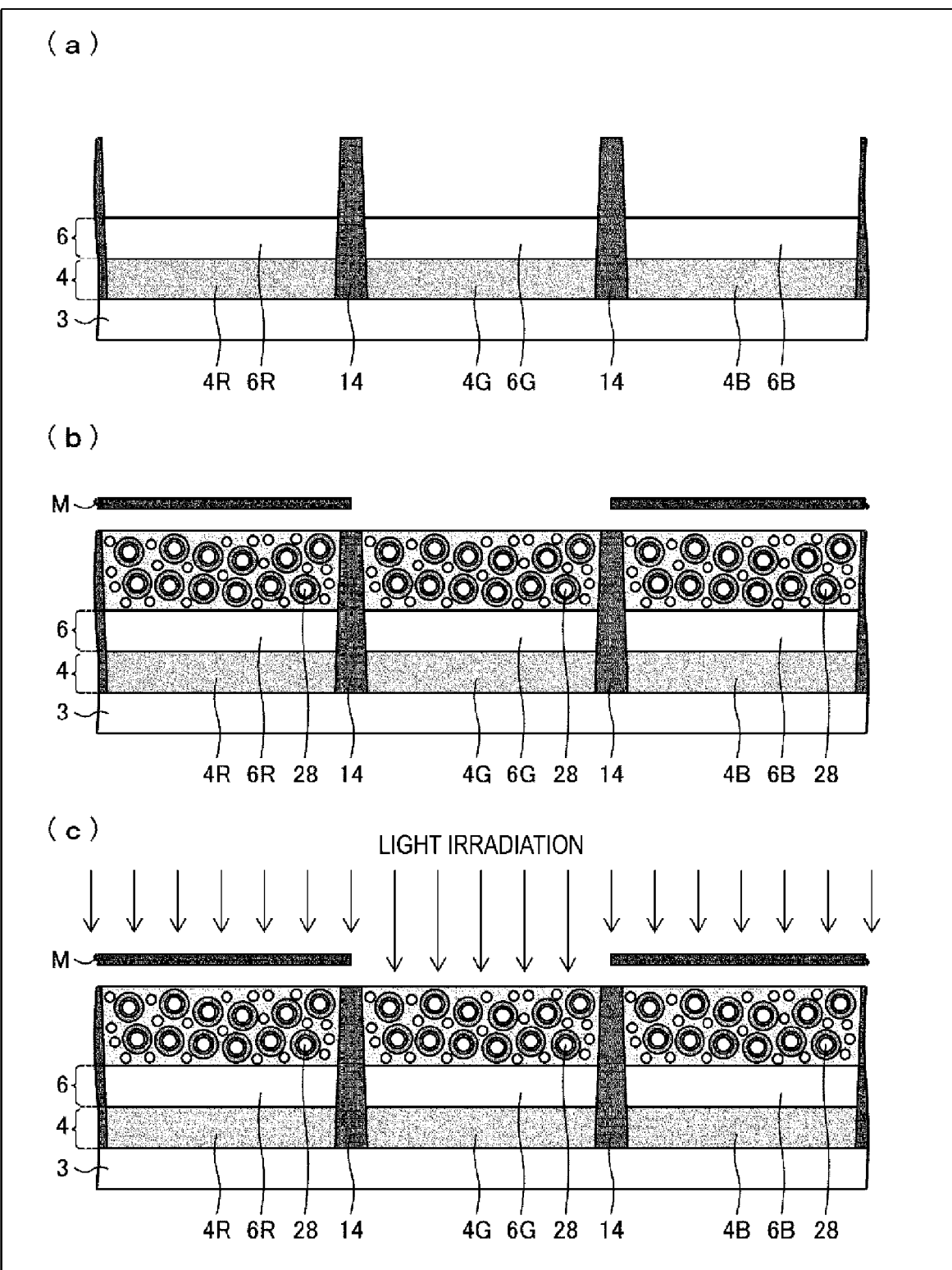
FIG. 7 is a forming-step cross-sectional view for describing light irradiation using a photomask in a step of forming a light-emitting layer according to the first embodiment of the disclosure.
Figure 8:
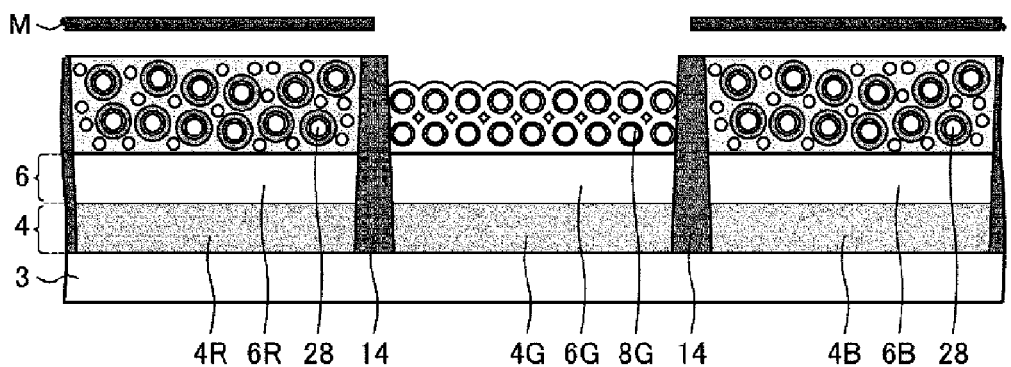
FIG. 8 is another forming-step cross-sectional view for describing light irradiation using a photomask in a step of forming a light-emitting layer according to the first embodiment of the disclosure.
Figure 8:
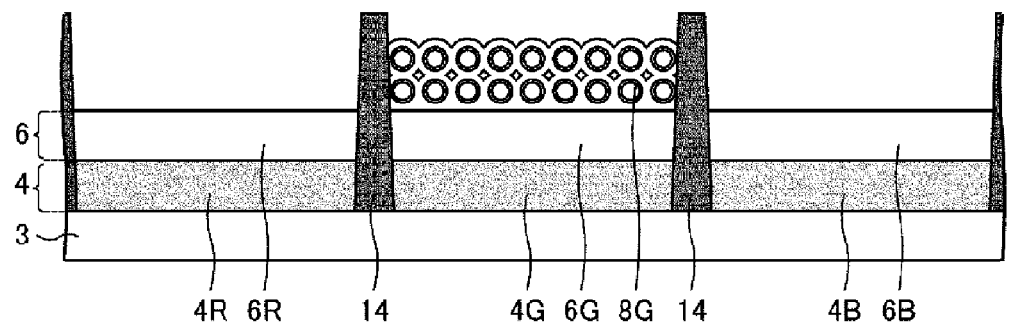
Figure 8:
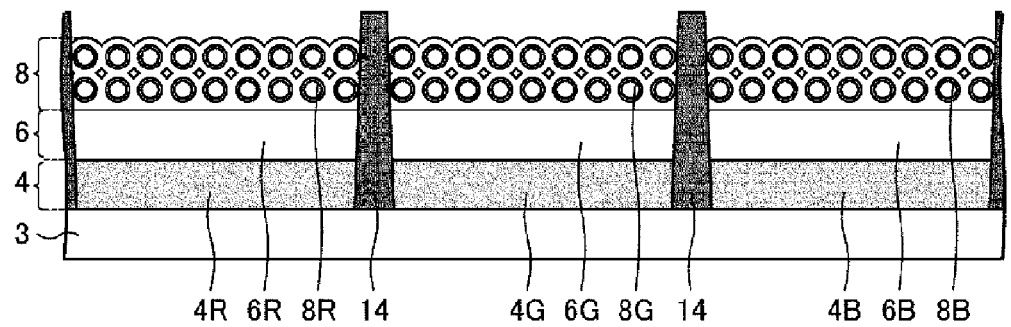

FIGS. 7 and 8 are forming-step cross-sectional views for describing a technique of forming the light-emitting layer 8 by partial exposure using a photomask in the step of forming the light-emitting layer. FIGS. 7 and 8 illustrate not only the position where the second light-emitting layer 8G is formed, but also the positions where the first light-emitting layer 8R and the third light-emitting layer 8B are formed.

As illustrated in (a) of FIG. 7, immediately before the step of forming the light-emitting layer is performed, the first electrode 4 and the first charge transport layer 6 partitioned by the edge covers 14 are formed on the array substrate 3. A photomask M depicted in (b) of FIG. 7 is disposed between the step of the first application and the step of the first light irradiation.

The photomask M has a function to block the light emitted in each of the steps of light irradiation. An opening is formed in the photomask M in such a manner that the opening is formed only at a position overlapping with the first electrode 4G when the photomask M is disposed above the array substrate 3. In other words, as illustrated in (b) of FIG. 7, when the photomask M is disposed above the array substrate 3, an upper portion of the first solution 28 at a position not overlapping with the first electrode 4G is blocked by the photomask M.

After the photomask M is disposed, by performing the step of the first light irradiation through the step of the third light irradiation, the light irradiation is performed only on the first solution 28 at the position overlapping with the first electrode 4G, as illustrated in (c) of FIG. 7. As a result, in the step of the first light irradiation through the step of the third light irradiation, the quantum dot 20 is heated only at the position overlapping with the first electrode 4G. Accordingly, as illustrated in (a) of FIG. 8, the second light-emitting layer 8G is formed only at the position overlapping with the first electrode 4G.

Next, after removing the photomask M from above the array substrate 3, a step of removal is performed in which the first solution 28 is removed at a position overlapping with a position different from the position where the light irradiation was performed, as illustrated in (b) of FIG. 8. With this, the step of forming the second light-emitting layer 8G is completed.

In the step of forming the light-emitting layer, in the case where the partial exposure using the laser irradiation or the photomask is employed as a technique for each light irradiation, the steps from the first application to the removal may be repeatedly performed in accordance with the luminescent colors of the corresponding light-emitting elements. For example, after the second light-emitting layer 8G depicted in (b) of FIG. 8 is formed, in order to form the first light-emitting layer 8R and the third light-emitting layer 8B, the steps from the first application to the removal may be each performed twice for the two layers, leading to three times in total.

In accordance with a type of the light-emitting layer 8 to be formed, a type of the solution to be applied in the step of the first application is changed, and the photomask M to be disposed above the array substrate 3 is also changed. Specifically, in each of the steps of light irradiation, the position of the opening of the photomask M is changed in accordance with the type of the light-emitting layer 8 so that the light irradiation is performed only at a position overlapping with the position of the light-emitting layer 8 to be formed.

As described above, the light-emitting layer 8 including the first light-emitting layer 8R, the second light-emitting layer 8G, and the third light-emitting layer 8B is formed as illustrated in (c) of FIG. 8.

In the present embodiment, a technique is described in which the light-emitting layer 8 partitioned by the edge covers 14 into respective light-emitting elements is formed. However, when partial exposure using laser irradiation or a photomask is employed for each light irradiation, it is possible to perform light irradiation individually on the position overlapping with each of the first electrodes 4. For this reason, the light-emitting layer 8 corresponding to each light-emitting element can be individually formed even in a case where the light-emitting layer 8 is not partitioned by the edge covers 14. Accordingly, in the case where the partial exposure is employed in each of the light irradiation, it is sufficient that the edge cover 14 has a height capable of covering an edge of the first electrode 4.

In the present embodiment, a method has been described in which the light-emitting layer 8 is formed in each of the first light-emitting element configured to emit red light, the second light-emitting element configured to emit green light, and the third light-emitting element configured to emit blue light in the step of forming the light-emitting layer. However, in the step of forming the light-emitting layer, the method is applicable to the step of forming the light-emitting layer 8 in a case where part of the light-emitting elements includes a different type of light-emitting layer 8 from a type thereof of another part of the light-emitting elements.

In the present embodiment, a period of time during which the third light irradiation is performed on the position corresponding to each of the first light-emitting element 2R, the second light-emitting element 2G, and the third light-emitting element 2B may differ depending on the luminescent color of the light-emitting element. In particular, the irradiation time of the third light irradiation with respect to the position corresponding to the second light-emitting element 2G is preferably shorter than the irradiation time of the third light irradiation with respect to the position corresponding to the first light-emitting element 2R. The irradiation time of the third light irradiation with respect to the position corresponding to the second light-emitting element 2G is preferably longer than the irradiation time of the third light irradiation with respect to the position corresponding to the third light-emitting element 2B.

In the step of the first application, when the first solution 28 is subjected to separately patterning by an ink-jet method and light irradiation is performed on the entire coating region, a photomask may be disposed above the array substrate 3 and light irradiation may be restarted in the middle of the step of the third light irradiation. This makes it possible to cause the irradiation time of the third light irradiation to differ depending on the luminescent color of the light-emitting element. In the case where the partial exposure described above is performed, the irradiation time of the third light irradiation may be made to differ in each partial exposure.

In the step of epitaxially growing the second shell 26 around the quantum dot 20, the longer the particle diameter of the quantum dot 20, the slower a growth rate of the second shell 26 is. That is, in the case where the second shells 26 of the same film thickness are formed around the quantum dots 20, the longer the particle diameter of the quantum dot 20, the longer the period of time of the third light irradiation required is.

Therefore, by causing the period of time of the light irradiation to differ in accordance with the luminescent color of the corresponding light-emitting element as in the above configuration, forming conditions of the light-emitting layers may be brought to be close to each other among the plurality of light-emitting elements. As a result, a variation in film thickness of the second shells 26 may be suppressed among the quantum dots 20 having mutually different particle diameters.

Subsequent to the step of forming the light-emitting layer, the second charge transport layer 10 is formed (step S6). The second charge transport layer 10 may be applied and formed in common to all of the subpixels by a spin coat technique or the like.

Finally, the second electrode 12 is formed (step S7). The second electrode 12 may be film-formed in common to all of the subpixels by vapor deposition or the like. As described above, the light-emitting element layer 2 is formed on the array substrate 3, and the light-emitting device 1 illustrated in FIG. 1 is obtained.

In the method for manufacturing the light-emitting device 1 in the present embodiment, the quantum dots 20 having a core/shell structure are applied, and thereafter the second shell 26 is epitaxially grown around the first shell 24 of each quantum dot 20. Because of this, the film thickness of the shell of each quantum dot 20 can be increased compared to the case where the quantum dots 20 having a core/shell structure are simply layered.

For example, in the quantum dot having a core/shell structure, it is considered to thicken the film thickness of the shell in order to reduce the exudation of electrons injected into the core of the quantum dot. However, when the quantum dots are formed by layering quantum dots having a thick film thickness of the shell, the packing ratio of the quantum dots with respect to the volume of the light-emitting layer becomes low. This makes it difficult to achieve a sufficient density of the quantum dots in the light-emitting layer, leading to a reduction in luminous efficiency of the light-emitting element.

In the method for manufacturing the light-emitting device 1 in the present embodiment, the quantum dots 20 each provided with the thin first shell 24 are applied, and thereafter the second shell 26 is formed on each quantum dot 20. In the light-emitting layer 8 of the present embodiment, the film thickness of the shell formed around the core 22 can be considered to be the total film thickness of the first shell 24 and the second shell 26.

As a result, the density of the quantum dots 20 in the light-emitting layer 8 can be enhanced compared to the case of simply layering the quantum dots provided with the shells having the same film thickness. Thus, the density of the quantum dots 20 in the light-emitting layer 8 is enhanced while reducing the electron exudation from the quantum dots 20, which leads to an improvement in luminous efficiency of the light-emitting device 1.

In the present embodiment, since at least one set of quantum dots 20 is connected via the second shell 26, an area of the outer surface of the second shell 26 is smaller in the above one set of quantum dots 20 than that in the case of not being connected. That is, in the present embodiment, an area of the outer surface of the quantum dot structure 16 can be reduced compared to the case where the quantum dots are simply layered.

By reducing the area of the outer surface of the quantum dot structure 16, the area of the surface of the second shell 26, through which moisture may infiltrate from the outside, can be reduced. Accordingly, this configuration may reduce damage to the second shell 26 due to the moisture infiltration, and may consequently suppress degradation in a surface protection function of the quantum dot 20 of the second shell 26 due to the damage described above.

When the ligand 18 coordinates on the outer surface of the quantum dot structure 16, the reduction of the area of the outer surface makes it possible to reduce the ligand 18 possible to be damaged by the moisture infiltration. Accordingly, it is possible to reduce the damage to the second shell 26 due to the loss of the protection function by the ligand 18 for the second shell 26 due to the damage described above.

By reducing the area of the outer surface of the quantum dot structure 16, it is possible to reduce the surface area of the second shell 26 possible to be damaged when the light-emitting device 1 is driven. Thus, the above-discussed configuration may reduce damage to the second shell 26 accompanying the drive of the light-emitting device 1, and may consequently reduce the formation of defects in the second shell 26 due to the damage. As a result, by reducing the area of the outer surface of the quantum dot structure 16, the occurrence of a non-emitting process caused by recombination of electrons and holes in the defects is suppressed, and consequently a decrease in luminous efficiency of the light-emitting device 1 is suppressed.

As described above, because of the outer surface of the quantum dot structure 16 being small, it is possible to reduce the area of the outer surface of the quantum dot structure 16 possible to be damaged, and reduce deactivation of the quantum dots 20 due to damage to the quantum dot structure 16.

According to NPL 1, the average value of a random close packing ratio in the packing of rigid spheres is approximately 63.66 percent. Accordingly, in the present embodiment, the proportion of the volume of the quantum dot structure 16 in the light-emitting layer 8 is preferably greater than or equal to 63.7 percent. With the above configuration, the density of the quantum dots 20 in the light-emitting layer 8 can be enhanced compared to the case of randomly layering quantum dots each provided with a shell whose film thickness is equal to the total film thickness of the first shell 24 and second shell 26. Furthermore, with the configuration described above, it is possible to efficiently decrease the area of the outer surface of the quantum dot structure 16 compared to the case of randomly layering quantum dots.

In the present embodiment, the average film thickness of the first shell 24 from the outer surface of the core 22 is smaller than the minimum film thickness of the second shell 26. Due to this, the quantum dots 20 may be more densely layered between the step of the second light irradiation and the step of the third light irradiation, and the second shell 26 having a relatively thick film thickness may be formed in the step of the third light irradiation performed later.

Thus, in the above-mentioned light irradiation steps, the first shell 24 and the second shell 26 may be formed having a film thickness able to sufficiently reduce the electron exudation from the core 22, derived from the electron wave function, in a state in which the quantum dots 20 are densely layered. Accordingly, with the configuration described above, it is possible to increase the density of the quantum dots 20 in the quantum dot structure 16 while sufficiently securing the film thicknesses of the first shell 24 and the second shell 26.

In the present embodiment, the light-emitting layer 8 is formed after the formation of the array substrate 3, the first electrode 4, the edge covers 14, and the first charge transport layer 6. However, heating for the formation of the light-emitting layer 8 is enabled by the heat generation of the quantum dots 20 by light irradiation. As a result, localized heating of the light-emitting layer 8 is enabled. Therefore, it is not absolutely necessary for the array substrate 3, the first electrode 4, the edge covers 14, and the first charge transport layer 6 to have high heat resistance against the heating in the step of light irradiation described above. Accordingly, the array substrate 3, the first electrode 4, the edge covers 14, and the first charge transport layer 6 may contain a known material.

The array substrate 3 may be, for example, a glass substrate containing alkali glass or the like. Further, the array substrate 3 may be an organic substrate containing an organic material such as polyimide. The array substrate 3 may contain a flexible material such as PET, and the flexible light-emitting device 1 may be obtained.

For example, when the light-emitting element layer 2 forms a bottom-emitting type light-emitting element and the first electrode 4 is an anode electrode, ITO is commonly used for the first electrode 4. When the first charge transport layer 6 is a hole transport layer, an inorganic material such as NiO, MgNiO, $Cr_2O_3$, $Cu_2O$, or $LiNbO_3$ may be contained.

In order to achieve a shape having a certain level of height and inclination, an organic material is generally used for the edge cover 14. In the present embodiment, the edge cover 14 may contain polyimide or the like.

For example, the second charge transport layer 10 may contain a material used for a known electron transport layer, and the second electrode 12 may contain a material used for a known cathode electrode.

Figure 9:
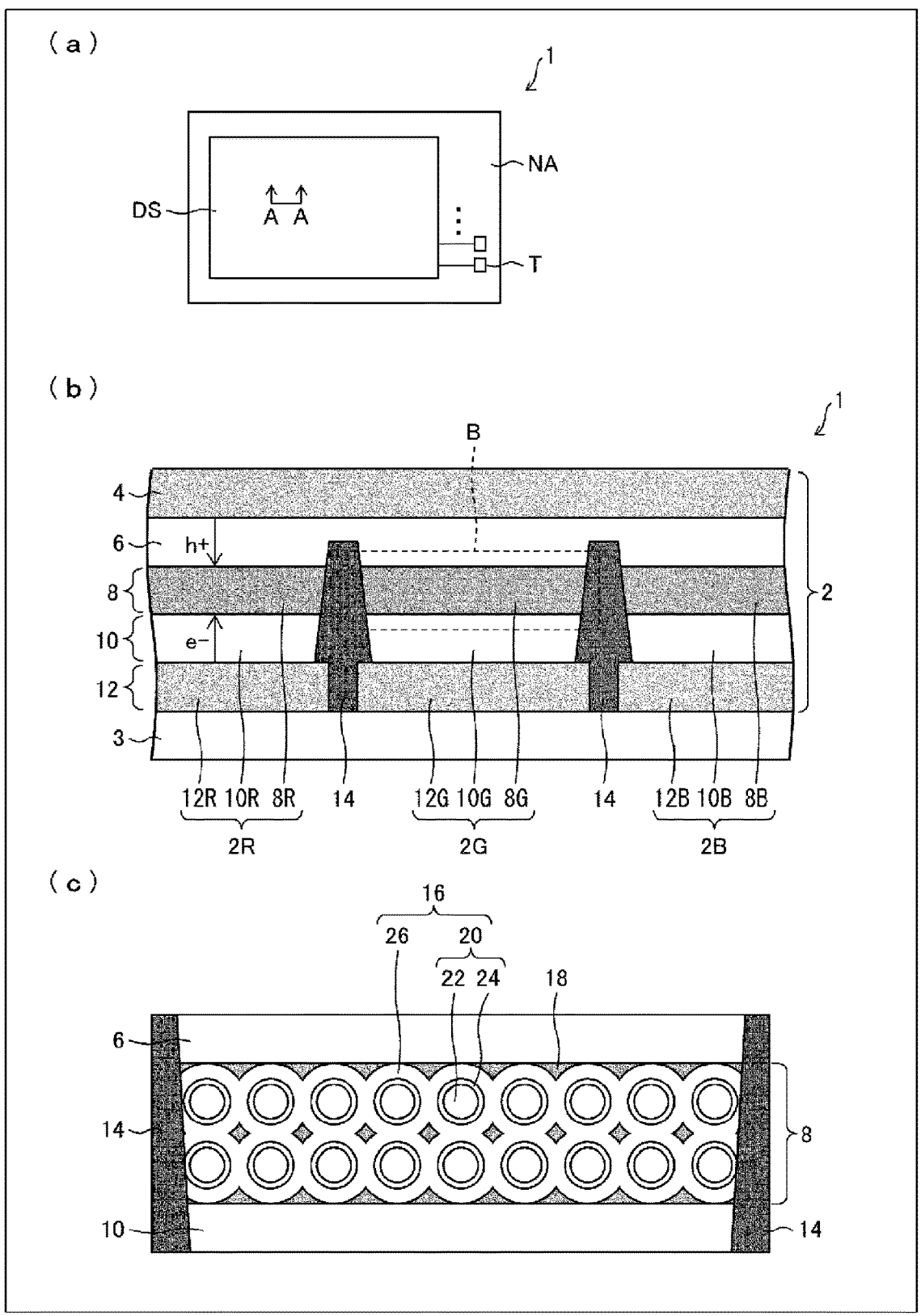
FIG. 9 includes a schematic top view and a schematic cross-sectional view of a light-emitting device according to a second embodiment of the disclosure, and a schematic enlarged view of a perimeter of a light-emitting layer of the light-emitting device.

Second Embodiment (a) of FIG. 9 is a schematic top view of a light-emitting device 1 according to the present embodiment. (b) of FIG. 9 is a cross-sectional view taken along a line A-A in the direction of the arrows in (a) of FIG. 9. (c) of FIG. 9 is an enlarged cross-sectional view of a region B in (b) of FIG. 9.

The light-emitting device 1 according to the present embodiment may have the same configuration as that of the light-emitting device 1 according to the previous embodiment except that the layering order of each of the layers in a light-emitting element layer 2 is reversed. In other words, the light-emitting element layer 2 according to the present embodiment includes a second charge transport layer 10, a light-emitting layer 8, a first charge transport layer 6, and a first electrode 4, which are sequentially layered from the lower layer on a second electrode 12.

In comparison with the light-emitting device 1 according to the previous embodiment, each of the second electrode 12 and the second charge transport layer 10 is separated by edge covers 14. In particular, in the present embodiment, the second electrode 12 is, by the edge covers 14, separated into a second electrode 12R for a first light-emitting element 2R, a second electrode 12G for a second light-emitting element 2G, and a second electrode 12B for a third light-emitting element 2B. Further, the second charge transport layer 10 is, by the edge covers 14, separated into a second charge transport layer 10R for the first light-emitting element 2R, a second charge transport layer 10G for the second light-emitting element 2G, and a second charge transport layer 10B for the third light-emitting element 2B.

In comparison with the light-emitting element 1 according to the previous embodiment, the first charge transport layer 6 and the first electrode 4 are not separated by the edge covers 14, and are each formed in a shared manner.

In the present embodiment, the first electrode 4 may be a transparent electrode and the second electrode 12 may be a reflective electrode. Therefore, light from the light-emitting layer 8 passes through the first charge transport layer 6 and the first electrode 4, and is emitted from a light-emitting face DS to the outside of the light-emitting device 1. Due to this, the light-emitting device 1 is configured as a top-emitting type light-emitting device. Because of this, in the present embodiment, an array substrate 3 need not necessarily be a transparent substrate.

The light-emitting device 1 according to the present embodiment can be manufactured by performing each of the steps illustrated in FIG. 2 in the order of step S1, step S7, step S3, step S6, step S5, step S4, and step S2 in a similar manner to that of the previous embodiment. Thus, in the present embodiment, the light-emitting layer 8 is formed after the formation of the array substrate 3, the second electrode 12, the edge covers 14, and the second charge transport layer 10.

For example, when the light-emitting element layer 2 forms a top-emitting type light-emitting element and the second electrode 12 is a cathode electrode, the second electrode 12 preferably has a function of reflecting light that is emitted in each of the light irradiation described above. With this configuration, in each of the light irradiation described above, not only the light directly emitted on the quantum dots 20, but also the light that has reached once to the second electrode 12 and reflected off the second electrode 12 may be effectively used as the light in each of the light irradiation. Thus, the step of light irradiation in the present embodiment may reduce the intensity of the light irradiation required to make the quantum dots 20 irradiated with sufficient light as compared to the step of light irradiation in the previous embodiment.

From the perspective of increasing the reflectivity of light emitted in the light irradiation described above, a metal material is preferably included. The second electrode 12 may include at least a reflective metal thin film on the surface thereof. For example, the second electrode 12 may include a metal such as Al or Ag, or an intermetallic compound such as AgMg.

Figure 10:
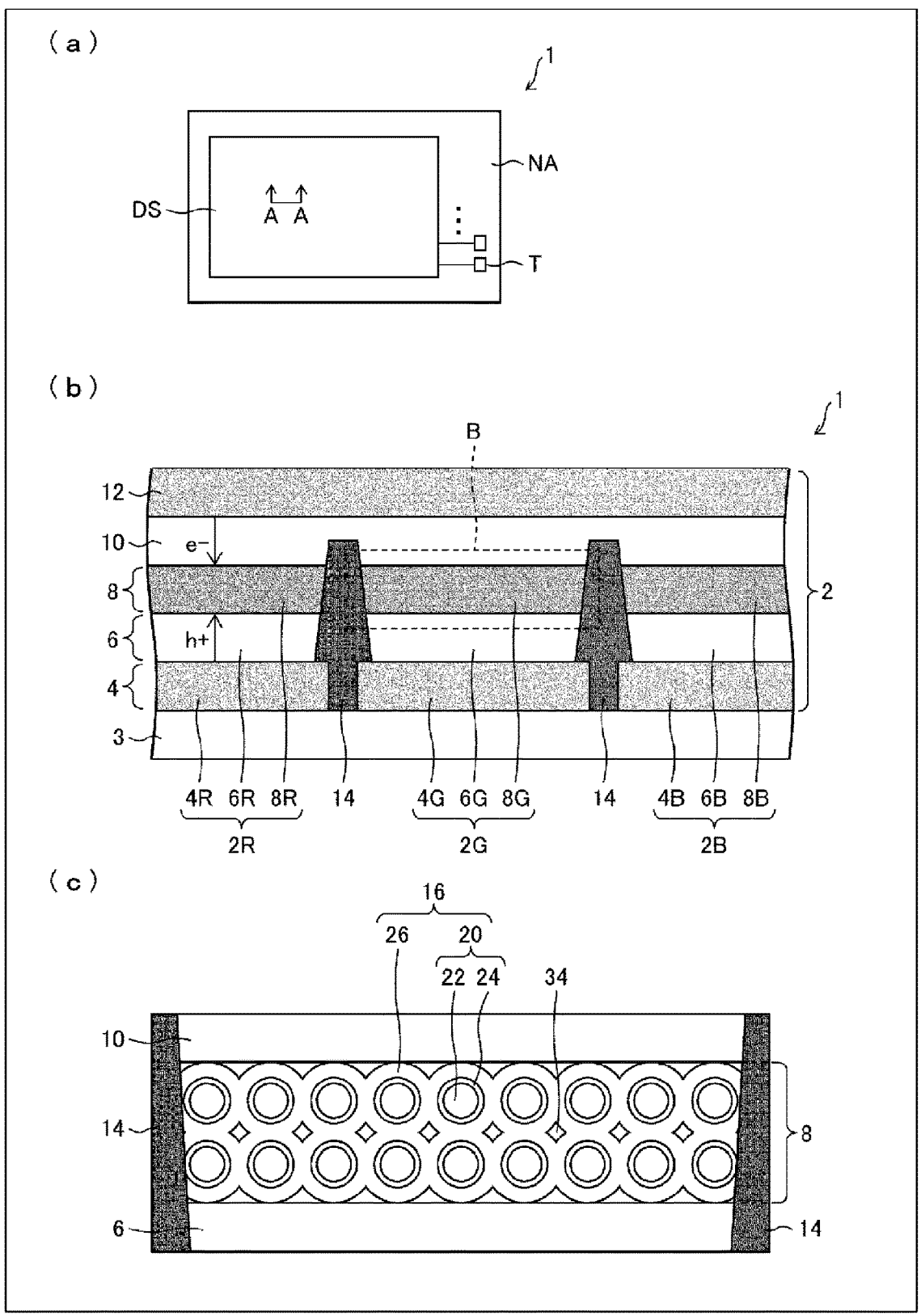
FIG. 10 includes a schematic top view and a schematic cross-sectional view of a light-emitting device according to a third embodiment of the disclosure, and a schematic enlarged view of a perimeter of a light-emitting layer of the light-emitting device.

Third Embodiment (a) of FIG. 10 is a schematic top view of a light-emitting device 1 according to the present embodiment. (b) of FIG. 10 is a cross-sectional view taken along a line A-A in the direction of the arrows in (a) of FIG. 10. (c) of FIG. 10 is an enlarged cross-sectional view of a region B in (b) of FIG. 10.

The light-emitting device 1 according to the present embodiment may have the same configuration as that of the light-emitting device 1 of the first embodiment except that a light-emitting layer 8 does not include a ligand 18. As illustrated in (c) of FIG. 10, the light-emitting layer 8 may include a void 34 in a space not filled with a quantum dot structure 16.

The light-emitting device 1 according to the present embodiment is manufactured by the same method except for step S5, that is, a step of forming the light-emitting layer among the steps illustrated in FIG. 2. The step of forming the light-emitting layer of the light-emitting device 1 according to the present embodiment will be described in more detail with reference to FIGS. 11 to 13.

Figure 11:
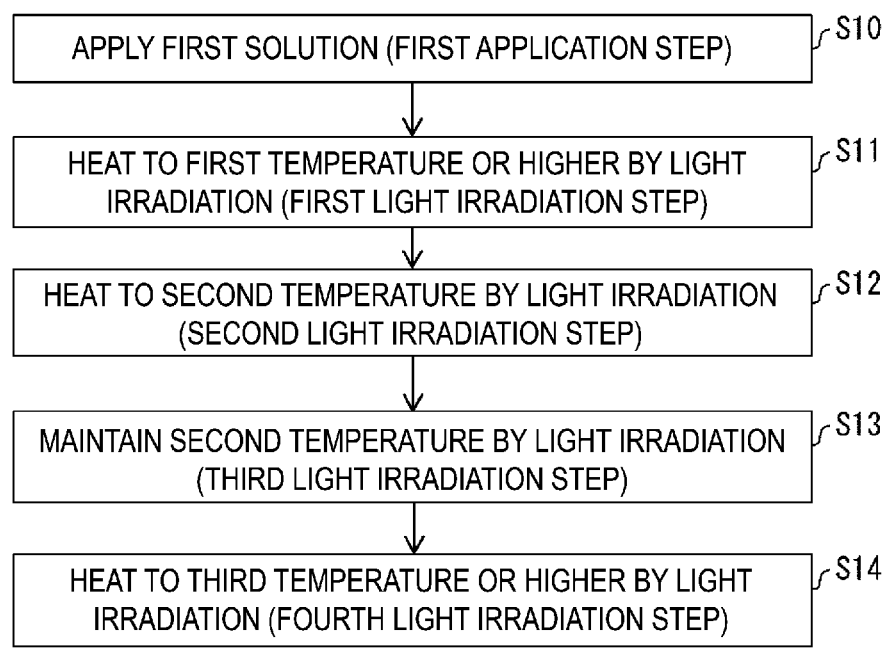
FIG. 11 is a flowchart for describing a method for forming a light-emitting layer according to the third embodiment of the disclosure.
Figure 12:
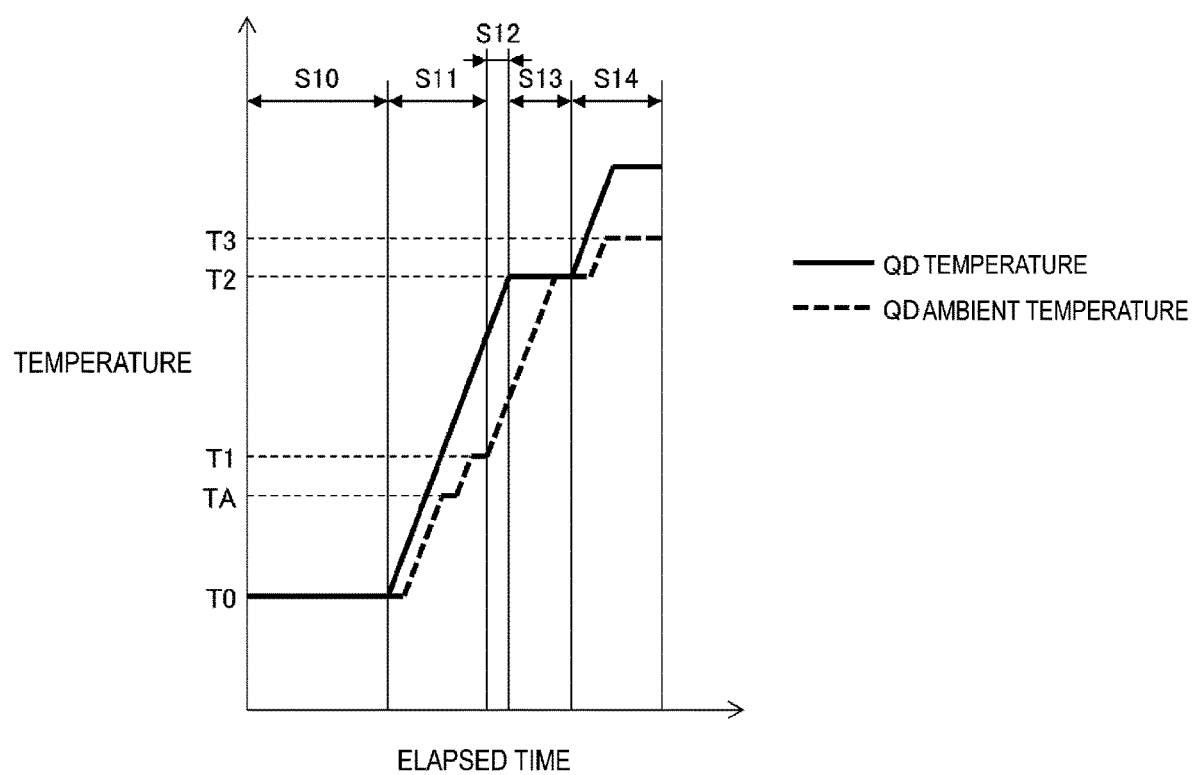
FIG. 12 is a graph for describing a relationship between an elapsed time and a temperature in a step of forming a light-emitting layer according to the third embodiment of the disclosure.
Figure 13:
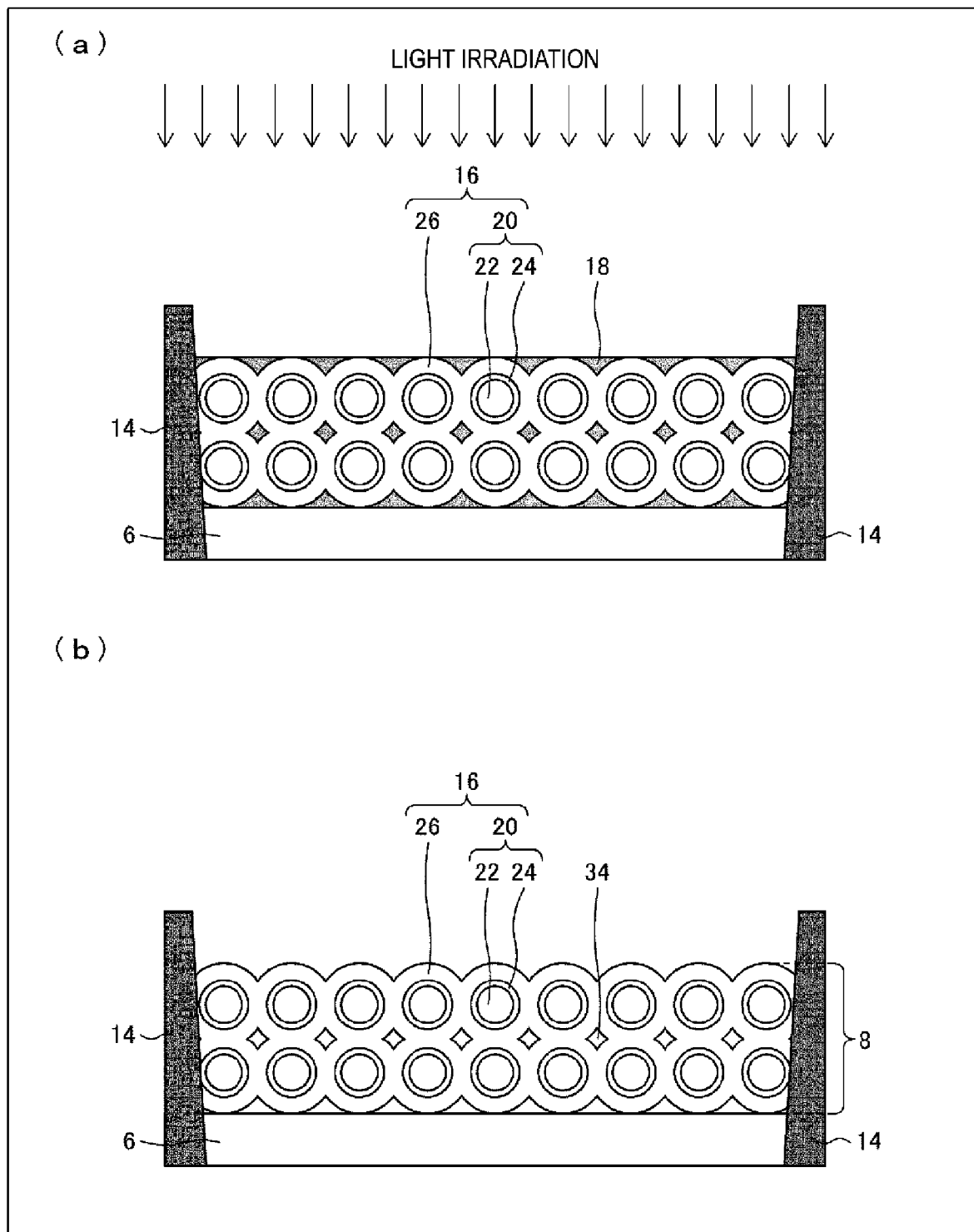
FIG. 13 is a forming-step cross-sectional view for describing a step of forming a light-emitting layer according to the third embodiment of the disclosure.

FIG. 11 is a flowchart for describing the step of forming the light-emitting layer corresponding to a step of forming a quantum dot layer in the present embodiment. FIG. 12 is a graph for describing a relationship between an elapsed time and a temperature in the step of forming the light-emitting layer. Similar to FIG. 4, a solid line in FIG. 12 depicts a temperature of quantum dots 20 on an array substrate 3, and a broken line depicts a temperature around the quantum dots 20. FIG. 13 is a forming-step cross-sectional view for describing the step of forming the light-emitting layer.

In the step of forming the light-emitting layer according to the present embodiment, the same method as that described in the first embodiment is performed from step S10 to step S13. At the point in time of the completion of step S13, the quantum dot structure 16 and a ligand 18 are formed in an upper layer relative to a first charge transport layer 6, as illustrated in (a) of FIG. 13.

In the present embodiment, subsequent to step S13, a step of fourth light irradiation is performed in such a manner that the fourth light irradiation is additionally performed to heat the quantum dots 20 to have a temperature equal to or higher than a third temperature T3 (step S14). In the fourth light irradiation, ultraviolet light may be emitted as in the first light irradiation, second light irradiation and third light irradiation, or light having a larger amount of energy per unit time than the light emitted in the third light irradiation may be emitted. The third temperature T3 is higher than the second temperature T2, and is equivalent to a boiling point of the ligand 18. For example, in the case where the ligand 18 is the aforementioned TOPO, the third temperature T3 is 411.2 degrees Celsius.

When the ambient temperature of the quantum dots 20 reaches the third temperature T3 by heating the quantum dots 20 in the step of the fourth light irradiation, evaporation of the ligand 18 begins and the ambient temperature of the quantum dots 20 maintains the third temperature T3 for a while. Thus, in the step of the fourth light irradiation, the ligand 18 vaporizes, thereby obtaining the light-emitting layer 8 without the ligand 18 as illustrated in (b) of FIG. 13.

In each of the light irradiation steps performed prior to the step of the fourth light irradiation of the present embodiment, the partial exposure using laser irradiation or using a photomask described in the first embodiment may be employed for each light irradiation. In this case, after repeatedly performing the first application step through the removal step in accordance with the luminescent color of the corresponding light-emitting element, the fourth light irradiation described above may be performed at a position overlapping with the position where the first solution was applied in the step of the first application.

This allows the ligand 18 in the light-emitting layer 8 to vaporize at a time after forming the light-emitting layer 8 having the ligand 18 for each luminescent color of the light-emitting element. Accordingly, with the configuration described above, the number of times the fourth light irradiation is performed may be reduced and consequently the manufacturing cost is reduced, in comparison with the case of individually performing the fourth light irradiation.

The light-emitting device 1 according to the present embodiment does not include the ligand 18 in the light-emitting layer 8. In general, a ligand coordinating with quantum dots includes an organic material in many cases. Because of this, the light-emitting layer 8 without the ligand 18 in the present embodiment has a low organic material content with respect to the inorganic material, and is resistant to deterioration due to moisture infiltration or the like. Accordingly, the light-emitting device 1 according to the present embodiment is able to further improve the reliability.

From the description of NPL 1 described earlier, the average value of the proportion of the voids not occupied by the rigid spheres in the space where the rigid spheres are randomly closely-packed is approximately 36.34 volume percent. Therefore, for example, in the light-emitting layer 8, a volume ratio of organic matter to inorganic matter is preferably equal to or smaller than 36.3 volume percent. In this case, the proportion of organic matter in the light-emitting layer 8 may be reduced in comparison with a light-emitting layer in which known quantum dots are randomly closely-packed and voids between the quantum dots are filled with an organic ligand. Accordingly, with the configuration described above, it is possible to more efficiently improve the reliability of the light-emitting layer 8.

The expression "without the ligand" or "not include the ligand" herein refers to a situation in which substantially no ligand is included. For example, in the light-emitting layer 8 of the present embodiment, a residue of impurities or ligands may remain to such an extent that the residue does not significantly degrade the reliability of the light-emitting layer 8. Specifically, the light-emitting layer 8 of the present embodiment may contain the residue of impurities or ligands mentioned above in an amount of approximately three volume percent with respect to the total volume of the light-emitting layer 8.

In the present embodiment as well, as in the previous embodiments, the area of the outer surface of the quantum dot structure 16 can be reduced. As a result, in the step of the fourth light irradiation in the present embodiment, the surface area of a second shell 26 possible to be damaged by the light irradiation and the heat generation of the quantum dots 20 due to the light irradiation may be reduced. Thus, with the above-discussed configuration, as described earlier, it is possible to suppress the formation of defects in the second shell 26 due to the damage to the second shell 26, and consequently suppress a reduction in luminous efficiency of the light-emitting device 1 due to the above defects.

Figure 14:
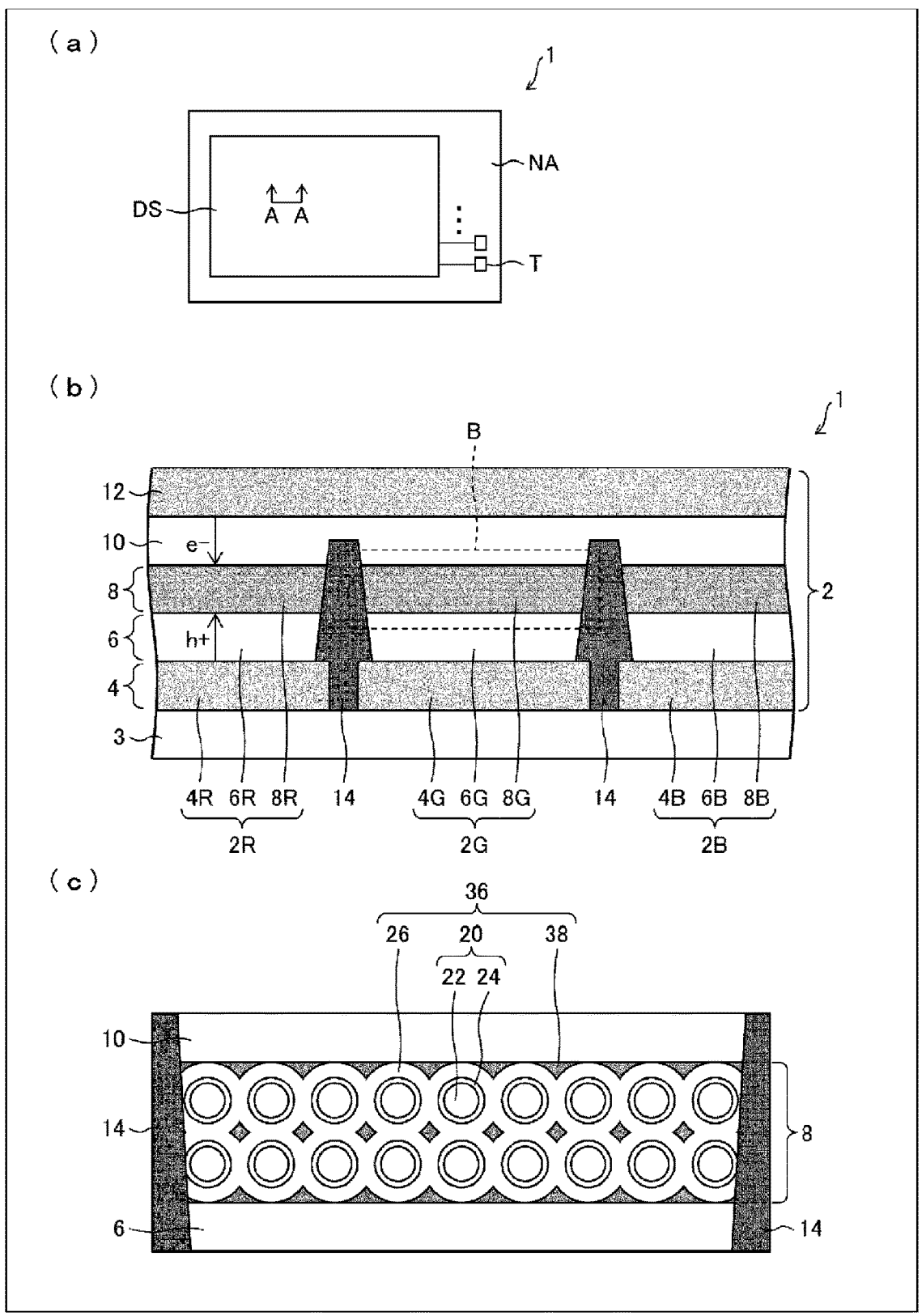
FIG. 14 includes a schematic top view and a schematic cross-sectional view of a light-emitting device according to a fourth embodiment of the disclosure, and a schematic enlarged view of a perimeter of a light-emitting layer of the light-emitting device.

Fourth Embodiment (a) of FIG. 14 is a schematic top view of a light-emitting device 1 according to the present embodiment. (b) of FIG. 14 is a cross-sectional view taken along a line A-A in the direction of the arrows in (a) of FIG. 14. (c) of FIG. 14 is an enlarged cross-sectional view of a region B in (b) of FIG. 14.

The light-emitting device 1 according to the present embodiment may have the same configuration as that of the light-emitting device 1 according to the previous embodiment except that a light-emitting layer 8 includes a quantum dot structure 36 in place of the quantum dot structure 16.

The quantum dot structure 36 further includes a third shell 38 in addition to a quantum dot 20 and a second shell 26, as illustrated in (c) of FIG. 14. The quantum dot structure 36 may be formed by providing the third shell 38 in the void 34, which is not filled with the quantum dot structure 16, of the light-emitting layer 8 in the previous embodiment.

The third shell 38 fills at least part of the voids in the periphery of the second shell 26. The third shell 38 may contain the same material as that of the second shell 26, and may contain an inorganic shell material used for a known quantum dot of a core/shell structure.

The light-emitting device 1 according to the present embodiment is manufactured by the same method except for step S5, that is, a step of forming the light-emitting layer among the steps illustrated in FIG. 2. The step of forming the light-emitting layer of the light-emitting device 1 according to the present embodiment will be described in more detail with reference to FIGS. 15 to 19.

Figure 15:
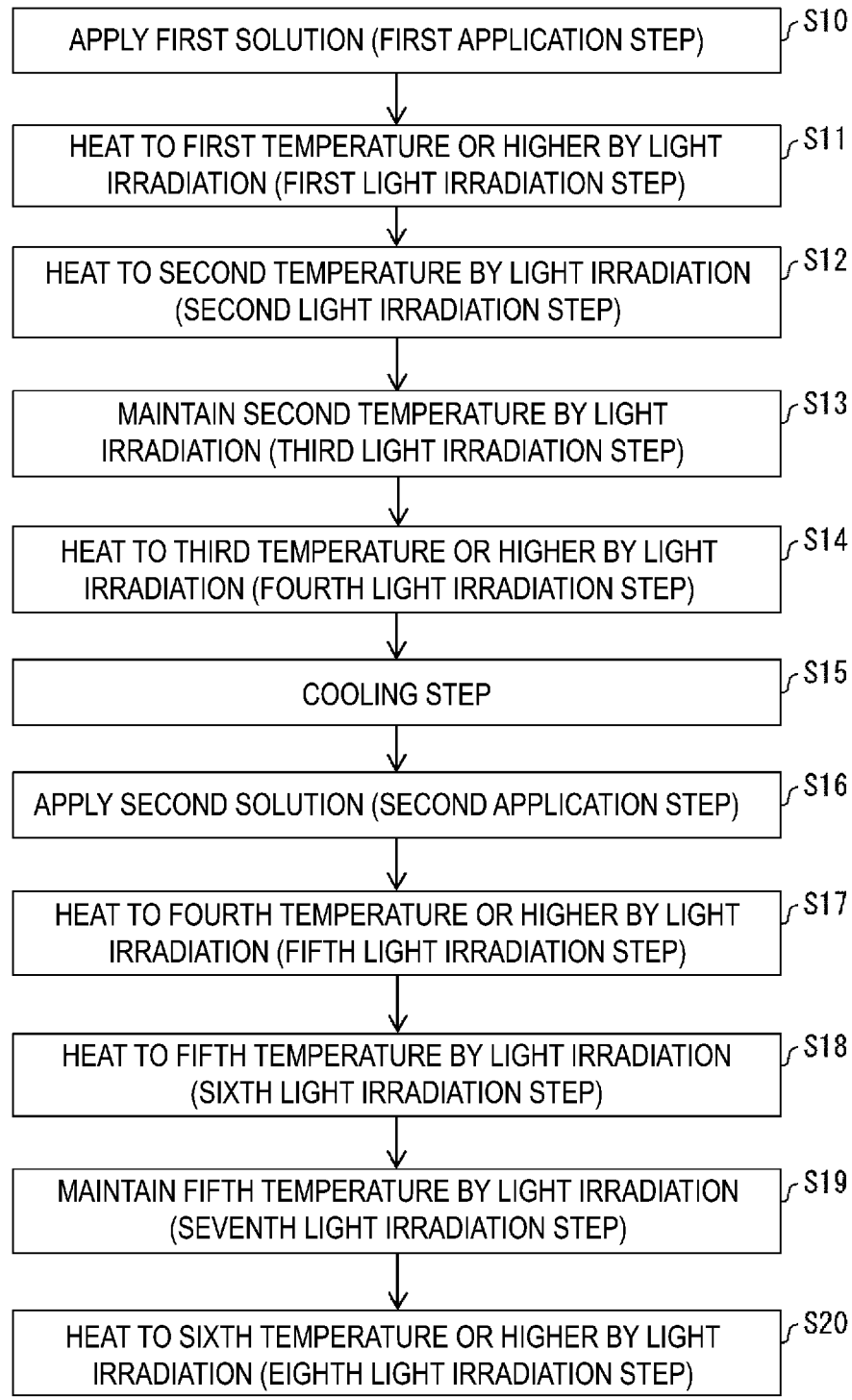
FIG. 15 is a flowchart for describing a method for manufacturing a light-emitting device according to the fourth embodiment of the disclosure.
Figure 16:
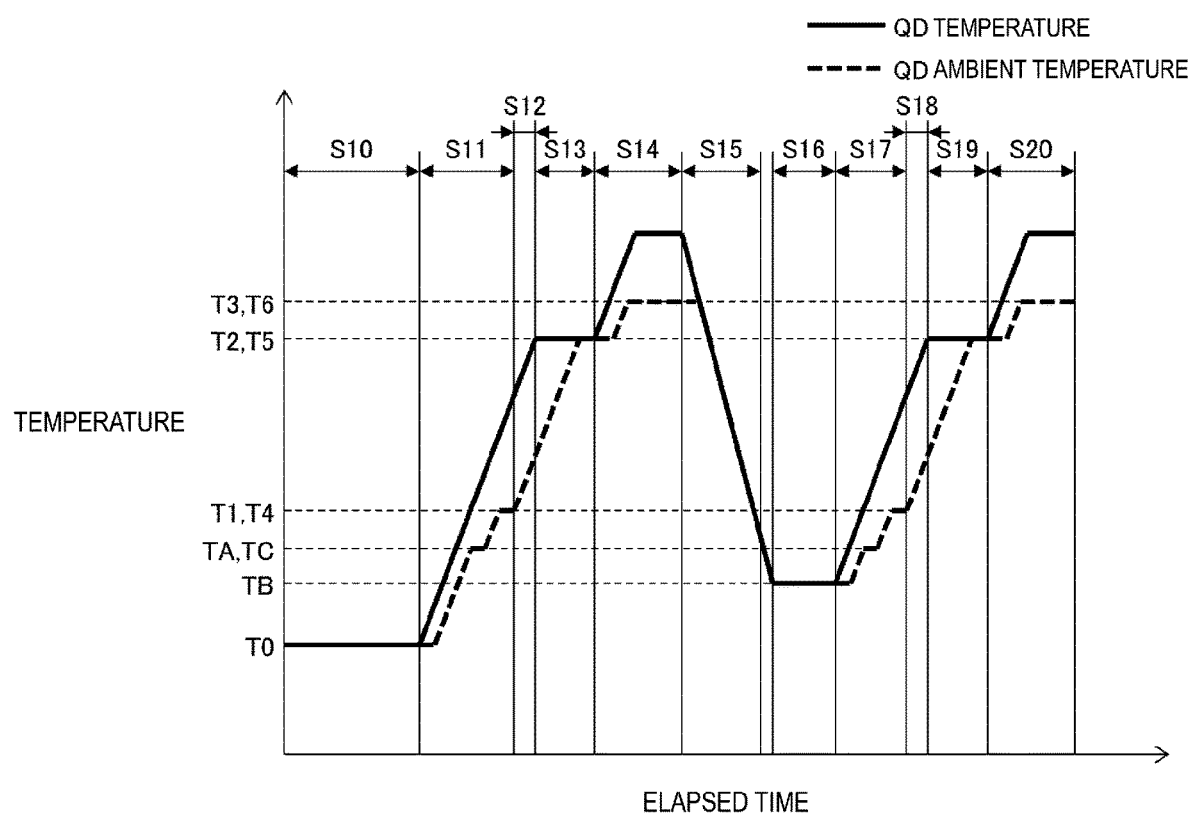
FIG. 16 is a graph for describing a relationship between an elapsed time and a temperature in a step of forming a light-emitting layer according to the fourth embodiment of the disclosure.
Figure 17:
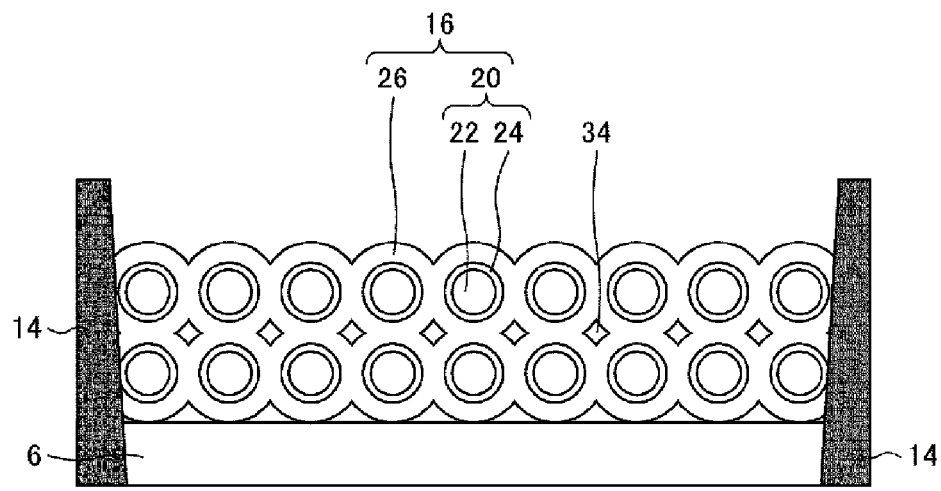
FIG. 17 is a forming-step cross-sectional view for describing a step of forming a light-emitting layer according to the fourth embodiment of the disclosure.
Figure 17:
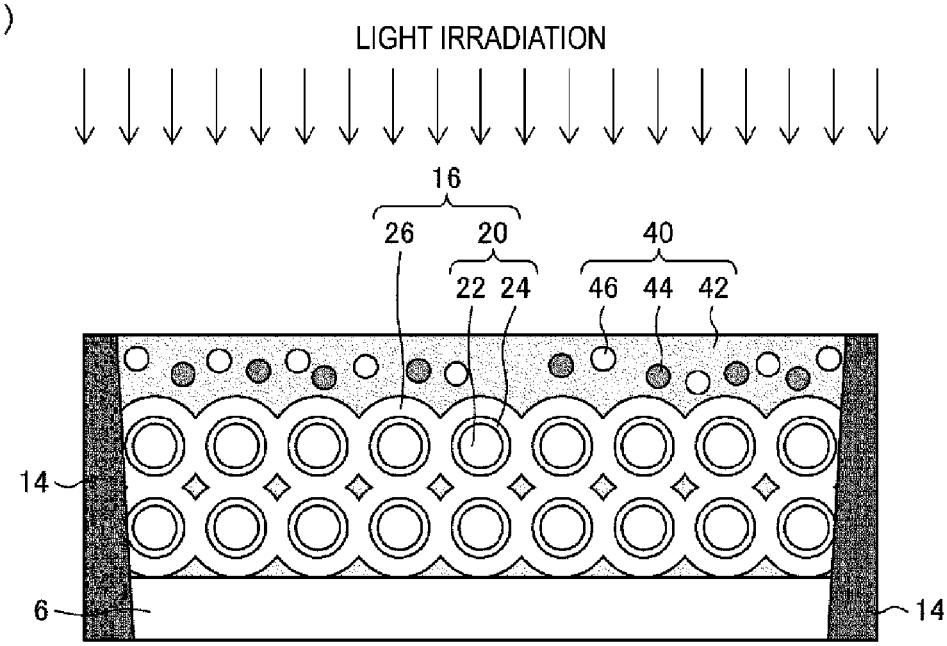
Figure 18:
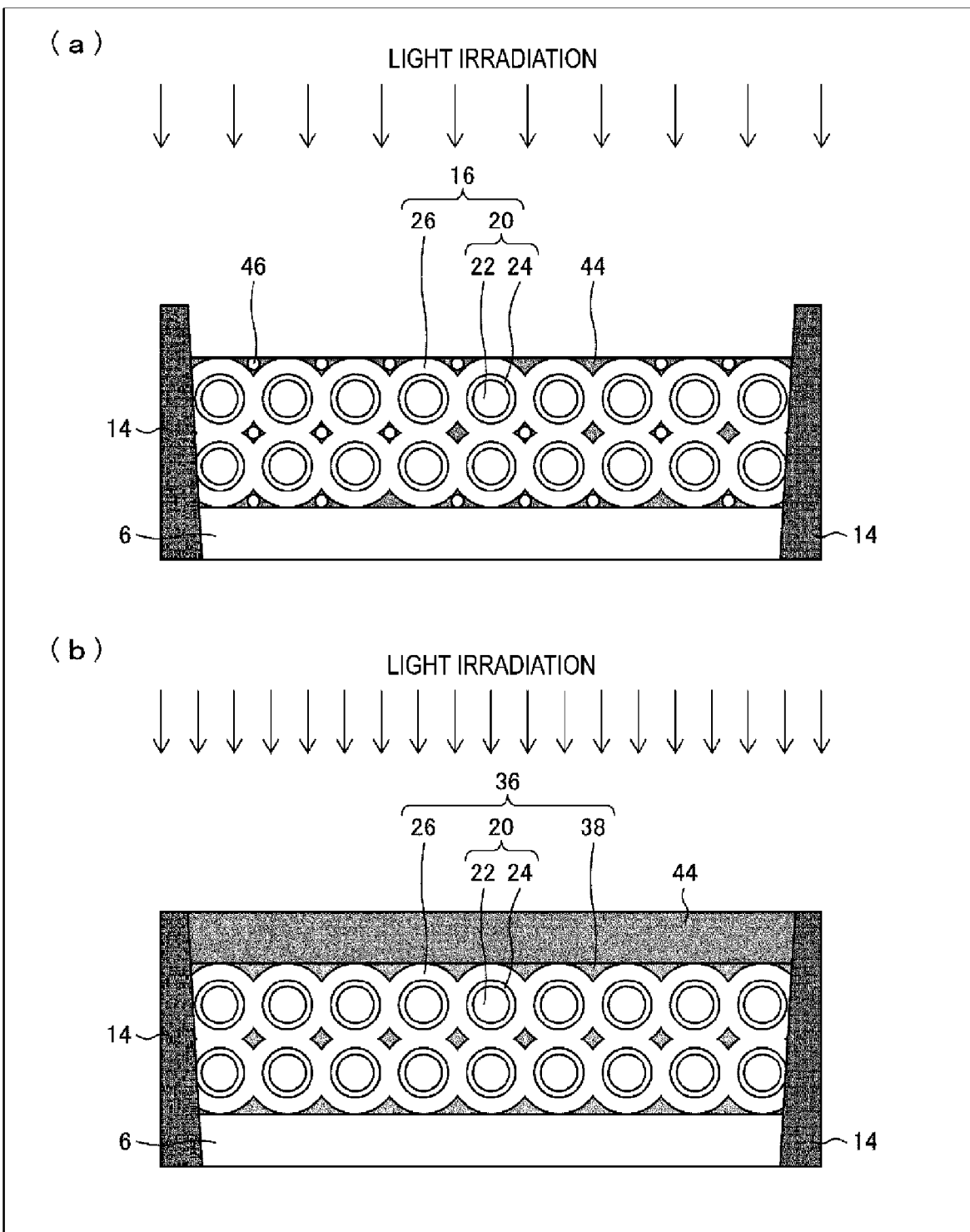
FIG. 18 is another forming-step cross-sectional view for describing a step of forming a light-emitting layer according to the fourth embodiment of the disclosure.
Figure 19:
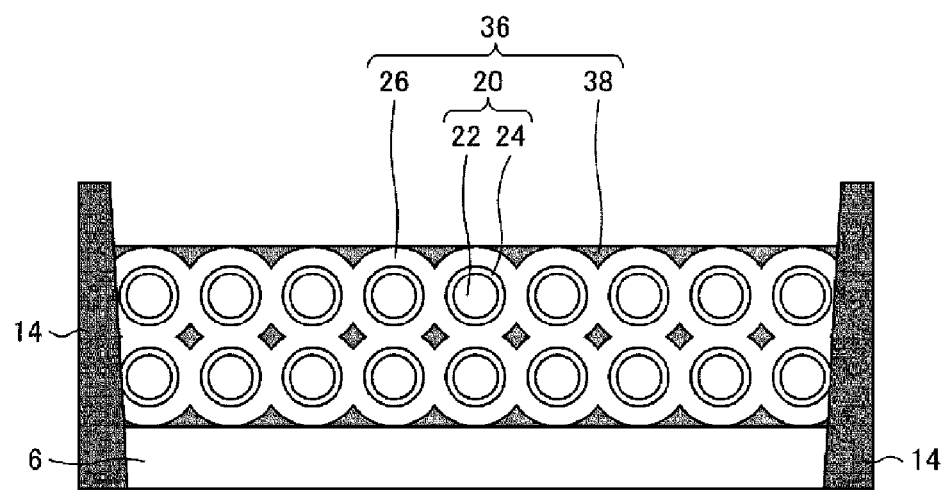
FIG. 19 is another forming-step cross-sectional view for describing a step of forming a light-emitting layer according to the fourth embodiment of the disclosure.

FIG. 15 is a flowchart for describing the step of forming the light-emitting layer corresponding to a step of forming a quantum dot layer in the present embodiment. FIG. 16 is a graph for describing a relationship between an elapsed time and a temperature in the step of forming the light-emitting layer. Similar to FIG. 4, a solid line in FIG. 16 depicts a temperature of the quantum dots 20 on an array substrate 3, and a broken line depicts a temperature around the quantum dots 20. FIGS. 17 to 19 are forming-step cross-sectional views for describing the step of forming the light-emitting layer.

In the step of forming the light-emitting layer according to the present embodiment, the same method as that described in the previous embodiment is performed from step S10 to step S14. In the present embodiment, subsequent to step S14, the light irradiation is stopped and a step of cooling is performed in which the temperature of the quantum dots 20 is lowered to a temperature equal to or lower than the third temperature T3 (step S15).

In the present embodiment, by the step of the cooling, the cooling is performed until the temperature of the quantum dots 20 becomes a temperature TB, which is lower than the temperature TA. The temperature TB may be higher than the temperature T0 or may be equal to the temperature T0. When the temperature of the quantum dots 20 drops, the temperature around the quantum dots 20 also drops. At the point in time of the completion of the cooling step, a quantum dot structure 16 is formed in an upper layer relative to a first charge transport layer 6, as illustrated in (a) of FIG. 17. At this point in time, a void 34 is formed between second shells 26 of the quantum dot structure 16.

After the temperature of the quantum dots 20 has reached the temperature TB by the step of the cooling, a step of second application is performed in which a second solution 40 is applied on a position overlapping with the array substrate 3 as illustrated in (b) of FIG. 17 (step S16). The step of the second application may allow at least part of the voids 34 in the periphery of the quantum dot structure 16 to be filled with the second solution 40, as illustrated in (b) of FIG. 17.

The second solution 40 contains a second solvent 42, an organic material 44, and a second inorganic precursor 46. The second solvent 42 may be the same as the first solvent 32, and may be hexane. The organic material 44 may be an organic material used for a ligand of known quantum dots, or may be the same material as that of the ligand 18. The second inorganic precursor 46 contains the same material as the third shell 38 described above. In a case where the material of the third shell 38 is the same as the material of the second shell 26, the second inorganic precursor 46 is the same as the first inorganic precursor 30.

Subsequently, a step of fifth light irradiation is performed (step S17), in which the fifth light irradiation is performed to irradiate the second solution 40 above the array substrate 3 with ultraviolet light so as to heat the quantum dots 20 again. In the step of the fifth light irradiation, the quantum dots 20 are heated until the quantum dots 20 have a fourth temperature T4 or higher as indicated in FIG. 16.

The fourth temperature T4 is the higher temperature of a melting point of the organic material 44 and a boiling point of the second solvent 42. A temperature TC indicated in FIG. 16 is the lower temperature of the melting point of the organic material 44 and the boiling point of the second solvent 42. The fourth temperature T4 and the temperature TC are higher than the temperature T0. The fourth temperature T4 may be equal to the first temperature T1, and the temperature TC may be equal to the temperature TA.

The ambient temperature of the quantum dots 20 follows a rise of the temperature of the quantum dots 20 with a slight delay, as depicted in FIG. 16, until the temperature of the quantum dots 20 rises from the temperature T0 to the temperature TC. However, when the ambient temperature of the quantum dots 20 rises up to the temperature TC and one of the melting of the organic material 44 and the evaporation of the second solvent 42 begins, the ambient temperature of the quantum dots 20 maintains the temperature TC for a while.

By further carrying on the fifth light irradiation, one of the melting of the organic material 44 and the evaporation of the second solvent 42 ends, and the ambient temperature of the quantum dots 20 begins to rise again. Then, when the ambient temperature of the quantum dots 20 rises up to the fourth temperature T4 and the other one of the melting of the organic material 44 and the evaporation of the second solvent 42 begins, the ambient temperature of the quantum dots 20 maintains the fourth temperature T4 for a while.

Thus, by the fifth light irradiation, the melting of the organic material 44 and the evaporation of the second solvent 42 are completed. After the completion of the step of the fifth light irradiation, as illustrated in (a) of FIG. 18, the second solvent 42 vaporizes from above the array substrate 3, and in the melted organic material 44, the second inorganic precursor 46 is dispersed in the voids 34 in the periphery of the quantum dot structure 16. Although the scale of the second inorganic precursor 46 is changed only in (a) of FIG. 18 for convenience of illustration, the actual shape of the second inorganic precursor 46 may be unchanged before and after the step of the first light irradiation.

Subsequently, a step of sixth light irradiation is performed in which the sixth light irradiation is performed on the position where the second solution 40 has been applied on the array substrate 3 so as to heat the quantum dots 20 (step S18). In the step of the sixth light irradiation, the sixth light irradiation is continued until the temperature of the quantum dots 20 reaches a fifth temperature T5 indicated in FIG. 16. In the sixth light irradiation, ultraviolet light may be emitted as in the fifth light irradiation, or ultraviolet light having a larger amount of energy per unit time than the ultraviolet light emitted in the fifth light irradiation may be emitted. The fifth light irradiation and the sixth light irradiation may be performed continuously.

Subsequently, from the point in time when the temperature of the quantum dots 20 reaches the fifth temperature T5, a step of seventh light irradiation is performed in which the seventh light irradiation is performed to maintain the temperature of the quantum dots 20 at approximately the fifth temperature T5 (step S19). In the seventh light irradiation, ultraviolet light may be emitted as in the fifth light irradiation and sixth light irradiation, or ultraviolet light having a smaller amount of energy per unit time than the ultraviolet light emitted in the sixth light irradiation may be emitted. Since the temperature of the quantum dots 20 is maintained at the fifth temperature T5 in the step of the seventh light irradiation, the ambient temperature of the quantum dots 20 after having reached the fifth temperature T5 is also maintained at the fifth temperature T5.

The fifth temperature T5 is higher than the fourth temperature T4, and is a temperature at which the second inorganic precursor 46 epitaxially grows around the second shell 26 by thermochemical reaction. Thus, while the ambient temperature of the quantum dots 20 is maintained at the fifth temperature T5, the second inorganic precursor 46 gradually grows epitaxially around the second shell 26. With this, the third shell 38 is formed around the second shell 26 of each of the quantum dot structures 36, as illustrated in (b) of FIG. 18.

Thus, as illustrated in (b) of FIG. 18, the quantum dot structure 36 including the quantum dot 20, the second shell 26, and the third shell 38 is formed. In the step of the seventh light irradiation, by the voids 34 being filled with the third shell 38, the melted organic material 44 is pushed up to an upper layer, whereby the organic material 44 remains in the upper layer of the quantum dot structure 36.

Subsequently, a step of eighth light irradiation is performed in which the eighth light irradiation is additionally performed to heat the quantum dots 20 so that the temperature of the quantum dots 20 becomes a sixth temperature T6 or higher (step S20). In the eighth light irradiation, ultraviolet light may be emitted as in the fifth light irradiation, sixth light irradiation and seventh light irradiation, or light having a larger amount of energy per unit time than the light emitted in the seventh light irradiation may be emitted. The sixth temperature T6 is higher than the fifth temperature T5, and is equivalent to the boiling point of the organic material 44.

When the ambient temperature of the quantum dots 20 reaches the sixth temperature T6 by the heating of the quantum dots 20 in the step of the eighth light irradiation, evaporation of the organic material 44 begins and the ambient temperature of the quantum dots 20 maintains the sixth temperature T6 for a while. Thus, in the step of the eighth light irradiation, the organic material 44 vaporizes and is removed from the upper layer of the quantum dot structure 36, as illustrated in FIG. 19. As described above, the step of forming the light-emitting layer in the present embodiment is completed.

In the light-emitting device 1 according to the present embodiment, the third shell 38 is formed around the second shell 26. Further, the third shell 38 is so formed as to fill the voids 34 in the periphery of the quantum dot structure 16.

Therefore, the proportion of the volume of the quantum dot structure 36 is high with respect to the total volume of the light-emitting layer 8, as compared to the quantum dot structure 16 of the previous embodiment. That is, in the light-emitting layer 8 of the present embodiment, the filling ratio of the shells formed around the cores 22 of the quantum dots 20 is further improved in the light-emitting layer 8. In other words, after the performing of the seventh light irradiation step, the density of inorganic matter with respect to the total volume of the light-emitting layer 8 is higher than that before the performing of the seventh light irradiation step. Accordingly, with the configuration described above, it is possible for the light-emitting device 1 according to the present embodiment to further improve the reliability of the light-emitting layer 8.

In the present embodiment, after the step of the third light irradiation is performed, the step of the fourth light irradiation may be omitted, and then the cooling step and the subsequent steps may be performed sequentially. That is, the vaporization of the ligand 18 and the vaporization of the organic material 44 may be carried out collectively in the step of the eighth light irradiation. This decreases the number of steps of the light irradiation, which leads to a reduction in tact time and a reduction in manufacturing cost.

In the present embodiment, although not limited thereto, the step of forming the light-emitting layer is described in the case where the fourth temperature T4 is equal to the first temperature T1, the fifth temperature T5 is equal to the second temperature T2, and the sixth temperature T6 is equal to the third temperature T3. Such a configuration may be realized simply and easily by making the first solvent 32 and the second solvent 42 be the same, the material of the ligand 18 and the organic material 44 be the same, and the first inorganic precursor 30 and the second inorganic precursor 46 be the same.

With this, the temperature as the heating reference for each light irradiation may be adjusted between the steps from the first light irradiation to fourth light irradiation and the steps from the fifth light irradiation to eighth light irradiation. Accordingly, the configuration described above leads to a simplification of the entire step of forming the light-emitting layer.

In each of the embodiments described above, a case has been described in which the quantum dot layer including the quantum dots 20 is the light-emitting layer 8. However, no such limitation is intended, and the first charge transport layer 6 or the second charge transport layer 10 may be the quantum dot layer including the quantum dots 20, for example. In this manner, in the case where each charge transport layer includes the quantum dots 20, these quantum dots 20 may be provided with a function to transport carriers. In this case, in comparison with a charge transport layer including known quantum dots, the stability of the quantum dots 20 in each charge transport layer is improved, so that the efficiency of carrier transport in each of the charge transport layers is improved, leading to an improvement in the luminous efficiency of the light-emitting device 1. Each of the charge transport layers including the quantum dots 20 described above may also be formed by the same technique as the step of forming the quantum dot layer in each of the embodiments.

In each of the above-described embodiments, a display device including a plurality of light-emitting elements and having a display light-emitting face DS is exemplified to describe the configuration of the light-emitting device 1. However, the disclosure is not limited thereto, and the light-emitting device 1 in each of the embodiments described above may be a light-emitting device including a single light-emitting element.

The disclosure is not limited to each of the embodiments described above, and various modifications may be made within the scope of the claims. Embodiments obtained by appropriately combining technical approaches disclosed in each of the different embodiments also fall within the technical scope of the disclosure. Furthermore, novel technical features can be formed by combining the technical approaches disclosed in each of the embodiments.

The invention claimed is:

1. A method for manufacturing a light-emitting device that is provided with, on a substrate, a light-emitting element including a first electrode, a second electrode, and a quantum dot layer interposed between the first electrode and the second electrode, the method comprising:
   forming the quantum dot layer, the forming the quantum dot layer including:
      performing first application that involves applying a first solution containing a plurality of quantum dots each including a core and a first shell with which the core is coated, a ligand to coordinate with each of the plurality of quantum dots, a first inorganic precursor, and a first solvent on a position overlapping the substrate,
      performing first light irradiation, subsequent to the performing of the first application, that involves irradiating with light, from above the substrate, the position where the first solution is applied, to melt the ligand and vaporize the first solvent,
      performing second light irradiation, subsequent to the performing of the first light irradiation, that involves irradiating the position with light to raise a temperature of the plurality of quantum dots, and
      performing third light irradiation, subsequent to the performing of the second light irradiation, that involves irradiating the position with light to cause the first inorganic precursor to epitaxially grow around the first shell so as to form a second shell with which the first shell is coated,
      wherein, in the performing of the third light irradiation, at least one set of the plurality of quantum dots adjacent to each other is connected to each other via the second shell.

2. The method for manufacturing the light-emitting device according to claim 1,
   wherein the plurality of quantum dots absorbs emitted light and generates heat in each of the performing of the first light irradiation, the performing of the second light irradiation, and the performing of the third light irradiation.

3. The method for manufacturing the light-emitting device according to claim 1,
   wherein a boiling point of the first solvent is equal to or higher than a melting point of the ligand, and in the performing of the first light irradiation, the first solvent vaporizes after the ligand melts.

4. The method for manufacturing the light-emitting device according to claim 1,
   wherein light having a smaller amount of energy per unit time than light emitted in the second light irradiation is emitted in the third light irradiation.

5. The method for manufacturing the light-emitting device according to claim 1,
   wherein the first light irradiation and the second light irradiation are performed consecutively.

6. The method for manufacturing the light-emitting device according to claim 1, further comprising:
   forming the first electrode including a reflective metal thin film on a surface of the first electrode prior to the forming of the quantum dot layer.

7. The method for manufacturing the light-emitting device according to claim 1,
   wherein a plurality of light-emitting elements, including the light-emitting element, is provided and the quantum dot layer is formed for each of the plurality of light-emitting elements, and in part of the plurality of light-emitting elements, a type of quantum dot layer different from a type of quantum dot layer in another part of the plurality of light-emitting elements is formed in the forming of the quantum dot layer.

8. The method for manufacturing the light-emitting device according to claim 7,
   wherein the plurality of light-emitting elements includes a first light-emitting element configured to emit red light, a second light-emitting element configured to emit green light, and a third light-emitting element configured to emit blue light.

9. The method for manufacturing the light-emitting device according to claim 8,
   wherein a concentration of the first inorganic precursor in the first solution applied on a position corresponding to each of the first light-emitting element, the second light-emitting element, and the third light-emitting element differs depending on a luminescent color of the corresponding light-emitting element.

10. The method for manufacturing the light-emitting device according to claim 9,
    wherein, in the performing of the first application, the concentration of the first inorganic precursor in the first solution applied on the position corresponding to the second light-emitting element is lower than the concentration of the first inorganic precursor in the first solution applied on the position corresponding to the first light-emitting element, and is higher than the concentration of the first inorganic precursor in the first solution applied on the position corresponding to the third light-emitting element.

11. The method for manufacturing the light-emitting device according to claim 8,
    wherein an irradiation time of the third light irradiation with respect to a position corresponding to each of the first light-emitting element, the second light-emitting element, and the third light-emitting element differs depending on a luminescent color of the corresponding light-emitting element.

12. The method for manufacturing the light-emitting device according to claim 11,
    wherein the irradiation time of the third light irradiation with respect to the position corresponding to the second light-emitting element is shorter than the irradiation time of the third light irradiation with respect to the position corresponding to the first light-emitting element, and is longer than the irradiation time of the third light irradiation with respect to the position corresponding to the third light-emitting element.

13. The method for manufacturing the light-emitting device according to claim 7,
wherein each of the plurality of light-emitting elements is individually provided with the first electrode, and the first solution is applied on a position overlapping each of the first electrodes by an ink-jet method in the performing of the first application.

14. The method for manufacturing the light-emitting device according to claim 1,
wherein partial exposure by laser irradiation is performed in each of the first light irradiation, the second light irradiation, and the third light irradiation.

15. The method for manufacturing the light-emitting device according to claim 1,
wherein partial exposure using a photomask is performed in each of the first light irradiation, the second light irradiation, and the third light irradiation.

16. The method for manufacturing the light-emitting device according to claim 14,
wherein a position on which the light irradiation is performed in the partial exposure is a position overlapping the first electrode.

17. The method for manufacturing the light-emitting device according to claim 14, further comprising:
removing, subsequent to the performing of the third light irradiation, the first solution at a position overlapping a position different from the position where the light irradiation has been performed in each of the first light irradiation, the second light irradiation, and the third light irradiation.

18. The method for manufacturing the light-emitting device according to claim 17, further comprising:
performing fourth light irradiation that involves irradiating a corresponding position with light to vaporize the ligand, after repeating the performing of the first application, the performing of the first light irradiation, the performing of the second light irradiation, the performing of the third light irradiation, and the removing of the first solution, in that order, based on luminescent colors of the corresponding light-emitting elements.

19. The method for manufacturing the light-emitting device according to claim 18,
wherein light having a larger amount of energy per unit time than light emitted in the third light irradiation is emitted in the fourth light irradiation on a position overlapping the position where the first solution has been applied in the performing of the first application.

20. The method for manufacturing the light-emitting device according to claim 1,
wherein the forming of the quantum dot layer further includes performing fourth light irradiation that involves irradiating a corresponding position with light to vaporize the ligand, subsequent to the performing of the third light irradiation.

21. The method for manufacturing the light-emitting device according to claim 20,
wherein light having a larger amount of energy per unit time than light emitted in the third light irradiation is emitted in the fourth light irradiation.

22. The method for manufacturing the light-emitting device according to claim 20,
wherein the plurality of quantum dots absorbs emitted light and generates heat in the performing of the fourth light irradiation.

23. The method for manufacturing the light-emitting device according to claim 1,
wherein the forming of the quantum dot layer further includes:
performing cooling, subsequent to the performing of the third light irradiation, that involves lowering the temperature of the plurality of quantum dots to a temperature equal to or lower than the lower temperature of the melting point of the ligand and the boiling point of the first solvent,
performing second application, subsequent to the performing of the cooling, that involves applying a second solution containing a second solvent, an organic material, and a second inorganic precursor on the position overlapping the substrate;
performing fifth light irradiation, subsequent to the performing of the second application, that involves irradiating with light, from above the substrate, the position where the second solution is applied so as to melt the organic material and vaporize the second solvent,
performing sixth light irradiation, subsequent to the performing of the fifth light irradiation, that involves irradiating the position with light to raise the temperature of the plurality of quantum dots, and
performing seventh light irradiation, subsequent to the performing of the sixth light irradiation, that involves irradiating the position with light to cause the second inorganic precursor to epitaxially grow around the second shell so as to form a third shell that fills at least part of a plurality of voids in a periphery of the second shell.

24. The method for manufacturing the light-emitting device according to claim 23,
wherein the plurality of quantum dots absorbs emitted light and generates heat in each of the performing of the fifth light irradiation, the performing of the sixth light irradiation, and the performing of the seventh light irradiation.

25. The method for manufacturing the light-emitting device according to claim 23,
wherein, after the performing of the seventh light irradiation, a density of inorganic matter with respect to an overall volume of the quantum dot layer is higher than a density before the performing of the seventh light irradiation.

26. The method for manufacturing the light-emitting device according to claim 23,
wherein light having a smaller amount of energy per unit time than light emitted in the sixth light irradiation is emitted in the seventh light irradiation.

27. The method for manufacturing the light-emitting device according to claim 23,
wherein the fifth light irradiation and the sixth light irradiation are performed consecutively.

28. The method for manufacturing the light-emitting device according to claim 23,
wherein the forming of the quantum dot layer further includes performing eighth light irradiation, subsequent to the performing of the seventh light irradiation, that involves irradiating a corresponding position with light to vaporize the organic material.

29. The method for manufacturing the light-emitting device according to claim 28, wherein light having a larger amount of energy per unit time than light emitted in the seventh light irradiation is emitted in the eighth light irradiation.

30. The method for manufacturing the light-emitting device according to claim 28,
wherein the plurality of quantum dots absorbs emitted light and generates heat in the performing of the eighth light irradiation.

31. The method for manufacturing the light-emitting device according to claim 23,
wherein the organic material is identical to a material of the ligand.

32. The method for manufacturing the light-emitting device according to claim 23,
wherein the forming of the quantum dot layer further includes performing fourth light irradiation, between the performing of the third light irradiation and the performing of the cooling, that involves irradiating a corresponding position with light to vaporize the ligand.

33. The method for manufacturing the light-emitting device according to claim 32,
wherein light having a larger amount of energy per unit time than light emitted in the third light irradiation is emitted in the fourth light irradiation.

34. The method for manufacturing the light-emitting device according to claim 32,
wherein the plurality of quantum dots absorbs emitted light and generates heat in the performing of the fourth light irradiation.

* * * * *